US005568311A

United States Patent [19]
Matsumoto

[11] Patent Number: 5,568,311
[45] Date of Patent: Oct. 22, 1996

[54] WAVELENGTH TUNABLE SEMICONDUCTOR LASER DEVICE

[75] Inventor: Keisuke Matsumoto, Itami, Japan

[73] Assignee: Mitsubishi Denki Kabushiki Kaisha, Tokyo, Japan

[21] Appl. No.: 452,158

[22] Filed: May 26, 1995

[30] Foreign Application Priority Data

May 30, 1994 [JP] Japan .................................. 6-116556

[51] Int. Cl.$^6$ ...................................................... H01S 3/19
[52] U.S. Cl. ............................................. 359/344; 372/46
[58] Field of Search .................................. 372/46, 20, 50; 359/344

[56] References Cited

U.S. PATENT DOCUMENTS

| | | | |
|---|---|---|---|
| 4,802,187 | 1/1989 | Bouley et al. | 372/96 |
| 4,835,779 | 5/1989 | Liou | 372/26 |
| 5,084,894 | 1/1992 | Yamamoto | 372/50 |
| 5,274,649 | 12/1993 | Hirayama et al. | 372/20 |
| 5,325,392 | 6/1994 | Tohmori et al. | 372/96 |
| 5,347,526 | 9/1994 | Suzuki et al. | 372/20 |

FOREIGN PATENT DOCUMENTS

| | | |
|---|---|---|
| 0467781 | 1/1992 | European Pat. Off. . |
| 4105386 | 4/1992 | Japan . |
| 5190960 | 7/1993 | Japan . |
| 5175586 | 7/1993 | Japan . |

OTHER PUBLICATIONS

Wolf et al, "Tunable Twin–Guide Lasers With Improved Performance Fabricated By Metal–Organic Vapor Phase Epitaxy", IEEE Photonics Technology Letters, vol. 5, No. 3, 1993, pp. 273–275.
Yamamoto et al, "Optical Modulation Characteristics of a Twin–Guide Laser by an Electric Field", Applied Physics Letters, vol. 59, No. 21, 1991, pp. 2721–2723.
Wolf et al, "Tunable Twin–Guide Lasers with Flat Frequency Modulation Response by Quantum Stark Effect", Applied Physics Letters, vol. 60, No. 20, pp. 2472–2474.
Yamamoto et al., "Wavelength Tuning Characteristics of DFB Lasers Having Twin–Guide Structures Modulated by Injection Current or Electric Field", IEE Proceedings–J, vol. 139, 1992, pp. 24–28.
Staring et al., "Wavelength–Independent Output Power From an Injection–Tunable DBR Laser", IEEE Photonics Technology Letters, vol. 6, No. 2, 1994, pp. 147–149.
Sakano et al., "Wavelength–Tunable Three–Electrode DBR Laser with a Thin–Active Layer in Tuning Regions", IEEE Photonics Technology Letters, vol. 3, No. 10, 1991, pp. 866–868.
Amann et al., "Continuously Tunable Laser Diodes: Longitudinal Versus Transverse Tuning Scheme", IEEE Journal on Selected Areas in Communications, vol. 8, No. 6, 1990, pp. 1169–1177.

*Primary Examiner*—Mark Hellner
*Attorney, Agent, or Firm*—Leydig, Voit & Mayer

[57] ABSTRACT

A wavelength tunable semiconductor laser device includes a semiconductor active layer located opposite a first conductivity type semiconductor substrate and producing light in response to current injected into the active layer; a semiconductor tuning layer located opposite the semiconductor substrate, having a refractive index that varies in response to an electric field applied to the tuning layer, and tuning the oscillation wavelength of the laser; a second conductivity type semiconductor spacer layer interposed between the active layer and the tuning layer; front and rear resonator facets located at opposite ends of the semiconductor active layer and the semiconductor tuning layer and having different reflectivities from each other; a first electrode supplying an electric field to the semiconductor tuning layer and divided into a plurality of portions in a resonator length direction of the laser; a second electrode for injecting current into the semiconductor active layer; and a third second electrodes and electrically connected to the semiconductor spacer layer.

14 Claims, 18 Drawing Sheets

WAVELENGTH TUNABLE SEMICONDUCTOR LASER DEVICE

FIELD OF THE INVENTION

The present invention relates to semiconductor laser devices and, more particularly, to an oscillation wavelength tunable semiconductor laser device employed in coherent optical communication systems.

BACKGROUND OF THE INVENTION

In recent years, wavelength tunable semiconductor lasers have been expected to be used as light sources or local oscillators in receivers in coherent optical systems or in wavelength division multiplexing systems in which light beams of different wavelengths are multiplexed to increase transmission capacity. Among various types of wavelength tunable lasers, distributed feedback (DFB) lasers and distributed Bragg reflector (DBR) lasers which do not employ external reflectors but include diffraction gratings have been extensively developed.

FIG. 19 is a perspective view illustrating a prior art wavelength tunable semiconductor laser disclosed in, for example, IEEE PHOTONICS TECHNOLOGY LETTERS, Vol. 5, No. 3, March 1993, pp. 273–275, "Tunable Twin-Guide Lasers with Improved Performance Fabricated by Metal-Organic Vapor Phase Epitaxy" T. Wolf, S. Illek, J. Rieger, B. Borchert, and W. Thulke. FIG. 20 is a sectional view perpendicular to the resonator length direction of the laser shown in FIG. 19.

In these figures, reference numeral 201 designates a p type InP substrate. A p type InP buffer layer 202 having a stripe-shaped ridge portion is disposed on the p type InP substrate 201. A tuning layer 203 is disposed on the ridge portion of the buffer layer 202. The tuning layer 203 comprises InGaAsP in a composition ratio equivalent to a band gap wavelength λg of 1.3 μm. An n type InP spacer layer 204 is disposed on the tuning layer 203. An active layer 205 is disposed on the spacer layer 204. The active layer 205 comprises InGaAsP in a composition ratio equivalent to a band gap wavelength λg of 1.55 μm. A p type InP guide layer 206 is disposed on the active layer 205. A diffraction grating layer 207 is disposed on the guide layer 206. An n type InP layer 209 is disposed on the buffer layer 202, contacting both sides of the ridge structure comprising the above-described layers 202 to 207. P type InP buffer layers 208b are disposed on the ridge structure and on the n type InP layer 209 except for a stripe-shaped region on the n type InP layer 209. P type InGaAsP contact layers 210 are disposed on the p type InP buffer layers 208b. An insulating film 211 is disposed on the surface of the structure. The insulating film 211 has an opening 211a on the contact layer and an opening 211b on the n type InP layer 209. A p side electrode 213 for laser operation contacts the contact layer 210 through the opening 211a of the insulating film 211, and a common n side electrode 212 contacts the n type InP layer 209 through the opening 211b of the insulating film 211. A p side electrode 214 for wavelength tuning is disposed on the rear surface of the substrate 201. An arrow 220 shows a current injected from the p side electrode 213 and producing laser light emission. An arrow 221 shows a reactive current that does not produce laser light emission. An arrow 222 shows a wavelength tuning current injected from the p side electrode 214.

This prior art wavelength tunable semiconductor laser is called a TTG (Tunable Twin-Guide) structure. Among TTG lasers, a TTG laser in which current is injected into a tuning layer (hereinafter referred to as a current-injected type TTG) provides the widest range of continuous wavelength tuning, theoretically.

A description is given of a method of fabricating this prior art laser.

Initially, the p type InP buffer layer 202, the InGaAsP tuning layer 203, the n type InP spacer layer 204, the InGaAsP active layer 205, the p type InP guide layer 206, and the diffraction grating layer 207 are successively grown on the p type InP substrate 201 using metal-organic vapor phase epitaxy (MOVPE). Then, the diffraction grating layer 207 is patterned by photolithography and etching to form a plurality of stripes periodically arranged in what becomes the resonator length direction of the laser, i.e., the light propagating direction. Thereafter, the p type InP buffer layer 208a is grown to bury the periodic stripes. Next, an $SiO_2$ film is deposited on the p type InP buffer layer 208a by sputtering and patterned in a stripe shape extending in the resonator length direction using photolithography and reactive ion etching (RIE). Using this stripe-shaped $SiO_2$ film as a mask, portions of the semiconductor laminated structure from the p type InP buffer layer 208a to the p type InP buffer layer 202 are etched away by RIE, forming a ridge-shaped waveguide (hereinafter referred to as a ridge waveguide) in which the width of the active layer is 1.2 μm. Using the stripe-shaped $SiO_2$ film as a mask for selective growth, the n type InP layer 209 is grown on the p type InP buffer layer 202 at opposite sides of the ridge waveguide. After removal of the $SiO_2$ film, the p type InP buffer layer 208b is grown on the n type InP layer 209 and on the p type InP buffer layer 208a and, successively, the p type InGaAsP contact layer 210 is grown on the buffer layer 208b. Thereafter, portions of the contact layer 210 and the buffer layer 208b are selectively removed until the surface of the n type InP layer 209 is exposed, followed by deposition of an insulating film 211, such as $SiO_2$, over the entire surface of the structure. Then, the opening 211a is formed in the insulating film 211 to expose the surface of the p type InGaAsP contact layer 210 opposite the ridge waveguide and the opening 211b is formed in the insulating film 211 to expose the surface of the n type InP layer 209. The upper p side electrode 213 is formed in contact with the exposed surface of the p type InGaAsP contact layer 210 and the n side electrode 212 is formed in contact with the exposed surface of the n type InP layer 209. Finally, the lower p side electrode 214 is formed on the rear surface of the p type InP substrate 201 to complete the TTG laser structure shown in FIG. 19.

A description is given of the operating principle.

As shown in FIG. 20, the current 220 contributing to the generation of laser light is supplied from the p side electrode 213 and flows through the p type InGaAs contact layer 210, the p type InP buffer layer 208, the p type InP guide layer 206, the active layer 205, the n type InP spacer layer 204, and the n type InP layer 209 to the n side electrode 212. On the other hand, the wavelength tuning current 222 is supplied from the p side electrode 214 and flows through the p type InP substrate 201, the p type InP buffer layer 202, the tuning layer 203, the n type InP spacer layer 204, and the n type InP layer 209 to the n side electrode 212. In this way, in the current-injected type TTG structure, the active layer 205 and the tuning layer 203, which layers sandwich the n type InP spacer layer 204, are individually controlled. Further, in the TTG structure, a main portion of the electric field of the laser light generated in the active layer 205 extends to the diffraction grating layer 207 and the tuning layer 203. Therefore, when the tuning current applied to the tuning layer 203 is varied while maintaining the laser driving current applied to the active layer 205 constant, i.e., while maintaining the gain of the laser light constant, the refractive index of the tuning layer 203 varies due to the plasma effect and the equivalent refractive index responded to by the photons varies, whereby the oscillation wavelength of the laser light is tuned.

Now assuming that the oscillation wavelength of the laser light is λ and the equivalent refractive index is $n_{eff}$, the relationship between λ and $n_{eff}$ is represented by $$\lambda = 2n_{eff}\Lambda$$

where Λ is the period of the diffraction grating.

When the variation in the equivalent refractive index due to the current injection into the tuning layer 203 is $\Delta n_{eff}$, the variation in the wavelength Δλ is represented by $$\Delta\lambda = 2\Delta n_{eff}\Lambda$$

In the above-described literature, when the laser driving current applied to the active layer 205 is 120 mA and the tuning current applied to the tuning layer 203 is 50 mA, a wavelength variation of 4.7 nm is obtained while maintaining the maximum laser output of 3 mW. When the laser driving current is 60 mA and the tuning current is 70 mA, a widest continuous tuning range of 5.1 nm is obtained.

However, when the refractive index of the tuning layer 203 is varied utilizing the plasma effect caused by the current injection into the tuning layer 203 as described above, injected carriers recombine at random, whereby the carrier concentration fluctuates, resulting in an increase in the spectral width of the laser light. Although the spectral width must be lower than several MHz in wavelength division multiplexing systems, the spectral width unfavorably increases with an increase in the wavelength tunable range. For example, in the prior art wavelength tunable semiconductor laser described in the literature, the spectral width varies in a range from 5.4 MHz to 50 MHz in response to the wavelength tunable range, and the spectral width becomes 26.5 MHz when the tunable range is 3 nm.

In order to prevent the unwanted increase in the spectral width, a reverse electric field is applied to the tuning layer to change the refractive index of the tuning layer, using the Franz-Keldysh effect, when the tuning layer is a bulk layer or using the quantum confined Stark effect when the tuning layer is a multiquantum well layer. For example, Applied Physics Letters 59(21), 18 Nov. 1991, pp. 2721–2723 "Optical modulation characteristics of a twin-guide laser by an electric field" and Applied Physics Letters 60(20), 18 May 1992, pp. 2472 to 2474 "Tunable twin-guide lasers with flat frequency modulation response by quantum confined Stark effect" disclose such electric field applied type TTG semiconductor laser.

FIG. 21 is a diagram for explaining the operation of the electric field applied type TTG semiconductor laser. The structure of this electric field applied TTG semiconductor laser is identical to the structure of the current injected type TTG semiconductor laser shown in FIG. 19. FIG. 21 is a sectional view of the waveguide part of the electric field applied type TTG laser along the resonator length direction. In the figure, the same reference numerals as in FIG. 19 designate the same or corresponding parts. Reference numeral 50 designates a power supply for supplying a laser driving current to the active layer 205. A resistor 51 is connected between the power source 50 and the laser element in series. Reference numeral 40 designates a variable power supply for supplying an electric field to the tuning layer 203. A resistor 41 is connected between the power supply 40 and the laser element in parallel. The power supply terminals connected to the spacer layer 204 in FIG. 21 are actually connected to the n side electrode 212 shown in FIG. 19.

A description is given of the operation.

In the electric field applied type TTG laser, a laser driving current from the power supply 50 is applied through the resistor 51 to the active layer 205 to produce a laser light and, simultaneously, a reverse bias voltage is applied across the n side electrode 212 and the lower p side electrode 214 by the variable power supply 40 and the resistor 41 to apply a reverse electric field to the tuning layer 203, whereby the refractive index of the tuning layer 203 is varied utilizing Franz-Keldysh effect or quantum confined Stark effect. In this way, the wavelength of the laser light is tuned.

In this electric field applied type TTG laser, since the fluctuation of the carrier concentration due to the random recombination of carriers in the tuning layer does not occur, the above-described problems of the current injected type TTG laser are avoided.

However, in the electric field applied type TTG layer, as mentioned in the above-described literatures, i.e., Applied Physics Letters 59(21), 18 Nov. 1991, pp. 2721 to 2723 and Applied Physics Letters 60(20), 18 May 1992, pp. 2472 to 2474, a wide wavelength tuning range cannot be obtained for the reasons described hereinafter.

That is, in the structure shown in FIG. 21, when a reverse electric field is applied to the tuning layer 203, the refractive index of the tuning layer 203 varies as shown by a curve k' in FIG. 22(b). Simultaneously with the variation in the refractive index, the magnitude of light absorption in the tuning layer 203 varies as shown by a curve k in FIG. 22(a) due to the Kramers-Kronig relations.

In FIG. 22(b), in the proximity of the laser oscillation wavelength of 1.55 μm, the variation in refractive index Δn1 due to the application of the reverse electric field to the tuning layer 203 is larger than 0, that is, the refractive index increases in variation. On the other hand, when the magnitude of absorption in the tuning layer 203 increases by Δα2 as shown in FIG. 22(a), the threshold current required for the laser oscillation is increased, i.e., the carrier concentration required for laser oscillation is increased, whereby the carrier concentration in the laser resonator is increased. Therefore, a negative variation in refractive index Δn2 (Δn2<0) in which the refractive index decreases is caused by the plasma effect. This negative variation in refractive index Δn2 cancels the above-described positive variation in refractive index Δn1 due to the application of the reverse electric field, so that the variation in refractive index of the whole laser resonator is reduced. As a result, the obtained wavelength tunable range is reduced.

As described above, although the prior art current injected type TTG laser provides a wide wavelength tunable range, the current injection causes noise. Therefore, it is difficult to obtain a sharp spectrum. Further, since the spectral width increases with an increase in the wavelength tunable range, adjacent spectrums affect each other when laser light is multiplexed and transmitted, resulting in poor transmission performance and poor practicability.

On the other hand, when an electric field is applied to the tuning layer of the above-described TTG laser in order to prevent the unwanted increase in the spectrum width, the variation in refractive index is reduced as a result of an increase in the magnitude of absorption in the tuning layer caused by the application of the electric field. Therefore, a wide wavelength tunable range cannot be obtained.

SUMMARY OF THE INVENTION

It is an object of the present invention to provide a wavelength tunable semiconductor laser device that emits laser light with narrow spectral width and that provides a wide tunable range of oscillation wavelength of laser light.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a wavelength tunable semiconductor laser device comprises a semiconductor substrate of a first conductivity type; a semiconductor active layer located above the semiconductor substrate and producing light in response to current injected into the active layer; a semiconductor tuning layer located above the semiconductor substrate, having a refractive index that is varied in response to an electric field applied to the tuning layer, and tuning the oscillation wavelength of the laser according to the variation in the refractive index due to the application of an electric field; a semiconductor spacer layer of a second conductivity type, opposite the first conductivity type, interposed between the active layer and the tuning layer; front and rear resonator facets located at opposite ends of the semiconductor active layer and the semiconductor tuning layer and having different reflectivities from each other; a first conductivity side electrode supplying an electric field to the semiconductor tuning layer and divided into a plurality of portions in the resonator length direction; a first conductivity side electrode for injecting current into the semiconductor active layer; and a second conductivity side electrode common to the first conductivity side electric field applying electrode and the first conductivity side current injecting electrode and electrically connected to the semiconductor spacer layer. Therefore, the total electric field applied to the tuning layer can be increased while maintaining the absorption loss of the entire resonator by controlling the electric fields applied to regions of the tuning layer opposite the divided electric field applying electrodes, whereby a positive variation in refractive index due to the application of the electric fields to the tuning layer can be achieved without being diminished by a negative variation in refractive index. As a result, the wavelength of the light generated in the active layer can be tuned in a wide tuning range without increasing the spectral width.

According to a second aspect of the present invention, the above-described wavelength tunable semiconductor laser device further comprises a variable voltage supply connected between each of the first conductivity side electric field applying electrodes and the second conductivity side common electrode. The variable voltage supply supplies a voltage to the laser structure so that absorption loss of the whole resonator caused by the application of an electric field is maintained constant regardless of the total magnitude of the electric fields applied by the first conductivity side electric field applying electrodes. Therefore, a positive variation in refractive index due to the application of the electric fields to the tuning layer can be achieved without being diminished by a negative variation in refractive index.

As a result, the wavelength of the light generated in the active layer can be tuned in a wide tuning range without increasing the spectral width.

According to a third aspect of the present invention, in the above-described wavelength tunable semiconductor laser, the semiconductor tuning layer is located above the semiconductor active layer. Therefore, a wavelength tunable semiconductor laser device that can tune the wavelength of light generated in the active layer in a wide tuning range without increasing the spectral width is realized in the structure where the tuning layer is located above the active layer.

According to a fourth aspect of the present invention, a wavelength tunable semiconductor laser device comprises a semiconductor substrate of a first conductivity type; a semiconductor active layer located above the semiconductor substrate and producing light in response to current injected into the active layer; a semiconductor tuning layer located above the semiconductor substrate, having a refractive index that is varied in response to an electric field applied to the tuning layer, and tuning the oscillation wavelength of the laser according to the variation in the refractive index due to the application of an electric field; a semiconductor spacer layer of a second conductivity type, opposite the first conductivity type, interposed between the active layer and the tuning layer; opposite front and rear resonator facets located at both ends of the semiconductor active layer and the semiconductor tuning layer and having different reflectivities from each other; a first conductivity side electrode for supplying an electric field to the semiconductor tuning layer; a first conductivity side electrode for injecting current into the semiconductor active layer and divided into a plurality of portions in the resonator length direction; and a second conductivity side electrode common to the first conductivity side electric field applying electrode and the first conductivity side current injecting electrode and electrically connected to the semiconductor spacer layer. Therefore, the magnitude of current injected from the respective current injecting electrodes can be controlled according to the electric field applied to the tuning layer so that the threshold carrier concentration of the entire resonator is maintained constant, whereby a negative variation in refractive index due to an increase in absorption loss in the electric field applied type TTG structure is avoided. As a result, sharp spectra are obtained in a wide wavelength range.

According to a fifth aspect of the present invention, the above-described wavelength tunable semiconductor laser device further comprises a power supply connected between each of the first conductivity side current injecting electrodes and the second conductivity side common electrode. The power supply supplies a voltage to the laser structure so that the threshold carrier concentration of the whole resonator is maintained constant regardless of magnitude of absorption loss of the whole resonator caused by the application of the electric field by the electric field applying electrode. Therefore, a negative variation in refractive index due to an increase in absorption loss in the electric field applied type TTG structure is avoided, resulting in a wavelength tunable semiconductor laser device that provides sharp spectra in a wide wavelength range.

According to a sixth aspect of the present invention, in the above-described wavelength tunable semiconductor laser device, the semiconductor tuning layer is located below the semiconductor active layer. Therefore, a wavelength tunable semiconductor laser device that provides sharp spectra in a wide wavelength range is realized in the laser structure in which the active layer is located above the tuning layer.

According to a seventh aspect of the present invention, a wavelength tunable semiconductor laser device comprises a semiconductor substrate of a first conductivity type; a semiconductor active layer located above the semiconductor substrate and producing light in response to current injected into the active layer; a semiconductor tuning layer located above the semiconductor substrate and comprising a plurality of regions arranged in the resonator length direction of the laser, which regions provide different variations in refractive index and absorption magnitude when an electric field is applied, which tuning layer tunes the oscillation wavelength of the laser according to the variation in the refractive index due to the application of an electric field; a semiconductor spacer layer of a second conductivity type, opposite the first conductivity type, interposed between the active layer and the tuning layer; front and rear resonator facets located at opposite ends of the semiconductor active layer and the semiconductor tuning layer and having different reflectivities from each other; a first conductivity side electrode for supplying an electric field to the semiconductor tuning layer and divided into a plurality of portions corresponding to the respective regions of the tuning layer; a first conductivity side electrode for injecting current into the semiconductor active layer; and a second conductivity side electrode common to the first conductivity side electric field applying electrode and the first conductivity side current injecting electrode and electrically connected to the semiconductor spacer layer. Therefore, the absorption loss of the light generated in the active layer caused by the application of an electric field to a region of the tuning layer can be controlled so that the absorption of the entire resonator does not change by controlling the strength of electric field applied to the other region of the tuning layer, whereby a negative variation in refractive index due to a variation in the absorption magnitude is avoided. As a result, a wide wavelength tunable range as a result of a positive variation in refractive index caused by the application of electric field to a region of the tuning layer is maintained, so that wavelength tuning in a wide range is realized.

According to an eighth aspect of the present invention, the above-described wavelength tunable semiconductor laser device further comprises a variable voltage supply connected between each of the first conductivity side electric field applying electrodes and the second conductivity side common electrode. The variable voltage supply supplies a voltage to the laser structure so that absorption loss of the whole resonator caused by the application of an electric field is maintained constant regardless of the total magnitude of the electric fields supplied by the first conductivity side electric field applying electrodes. Therefore, a negative variation in refractive index due to a variation in the absorption magnitude is avoided, whereby a wide wavelength tunable range as a result of a positive variation in refractive index caused by the application of electric field to a region of the tuning layer is maintained, resulting in a wavelength tunable semiconductor laser device that can tune the wavelength in a wide range.

According to a ninth aspect of the present invention, a wavelength tunable semiconductor laser device comprises a semiconductor active layer producing light in response to current injected into the active layer; a semiconductor tuning layer having a refractive index that varies in response to an electric field applied to the tuning layer and tuning the oscillation wavelength of the laser according to the variation in the refractive index; a semiconductor layer providing a periodic diffraction grating in the resonator length direction; a first conductivity side electrode for applying a first electric field to the semiconductor tuning layer; a first conductivity side electrode for injecting current into the semiconductor active layer; a first conductivity side electrode for applying a second electric field to the semiconductor layer providing the diffraction grating so that the second electric field increases the coupling constant of the diffraction grating and compensates absorption loss caused by the application of the first electric field to the tuning layer; and a second conductivity side electrode common to the first conductivity side first electric field applying electrode, the first conductivity side current injecting electrode, and the first conductivity side second electric field applying electrode. Therefore, a negative variation in refractive index due to a variation in absorption magnitude is avoided, resulting in a wavelength tunable semiconductor laser device that can tune the wavelength in a wide range.

According to a tenth aspect of the present invention, the above-described wavelength tunable semiconductor laser device further comprises a first conductivity type semiconductor substrate on which the semiconductor active layer is disposed and a spacer layer disposed on the active layer. The semiconductor tuning layer is disposed on the spacer layer, and the semiconductor layer providing the diffraction grating is disposed in contact with the semiconductor tuning layer. The second conductivity side common electrode is electrically connected to the semiconductor spacer layer. The first conductivity side first electric field applying electrode also serves as the first conductivity side second electric field applying electrode. Therefore, a TTG semiconductor laser device that can tune the wavelength in a wide range is realized.

According to an eleventh aspect of the present invention, the above-described wavelength tunable semiconductor laser device further comprises a semiconductor substrate of a second conductivity type and having opposite front and rear surfaces. The semiconductor active layer, the semiconductor tuning layer, and the semiconductor layer providing the diffraction grating are located on the front surface of the semiconductor substrate positionally in series in the resonator length direction. The first conductivity side first electric field applying electrode, the first conductivity side current injecting electrode, and the first conductivity side second electric field applying electrode are located positionally in series and opposite the tuning layer, the active layer, and the semiconductor layer providing the diffraction grating, respectively. The second conductivity side common electrode is disposed on the rear surface of the semiconductor substrate. Therefore, a DBR semiconductor laser device that can tune the wavelength in a wide range is realized.

According to a twelfth aspect of the present invention, a wavelength tunable semiconductor laser device comprises a semiconductor active layer producing light in response to current injected into the active layer; a semiconductor tuning layer having a refractive index that varies in response to an electric field applied to the tuning layer and tuning the oscillation wavelength of the laser according to the variation in the refractive index; a first conductivity side electrode for applying an electric field to the semiconductor tuning layer; a first conductivity side electrode for injecting current to the semiconductor active layer; a second conductivity side electrode common to the first conductivity side electric field applying electrode and the first conductivity side current injecting electrode; and a light modulator controlling the quantity of light generated in and transmitted through the active layer so that absorption loss caused by the application of an electric field to the tuning layer is compensated. Therefore, a negative variation in refractive index due to a variation in absorption magnitude is avoided, resulting in a wavelength tunable semiconductor laser device that can tune the wavelength in a wide range.

According to a thirteenth aspect of the present invention, in the above-described wavelength tunable semiconductor laser device, the light modulator and the active layer are disposed on different substrates. Therefore, a negative variation in refractive index due to a variation in absorption magnitude is avoided, resulting in a wavelength tunable semiconductor laser device that can tune the wavelength in a wide range.

According to a fourteenth aspect of the present invention, in the above-described wavelength tunable semiconductor laser device, the light modulator and the active layer are integrated on the same substrate. Therefore, an integrated wavelength tunable semiconductor laser device that can tune the wavelength in a wide range is realized.

DETAILED DESCRIPTION OF THE PREFERRED EMBODIMENTS

Embodiment 1

Figure 1:
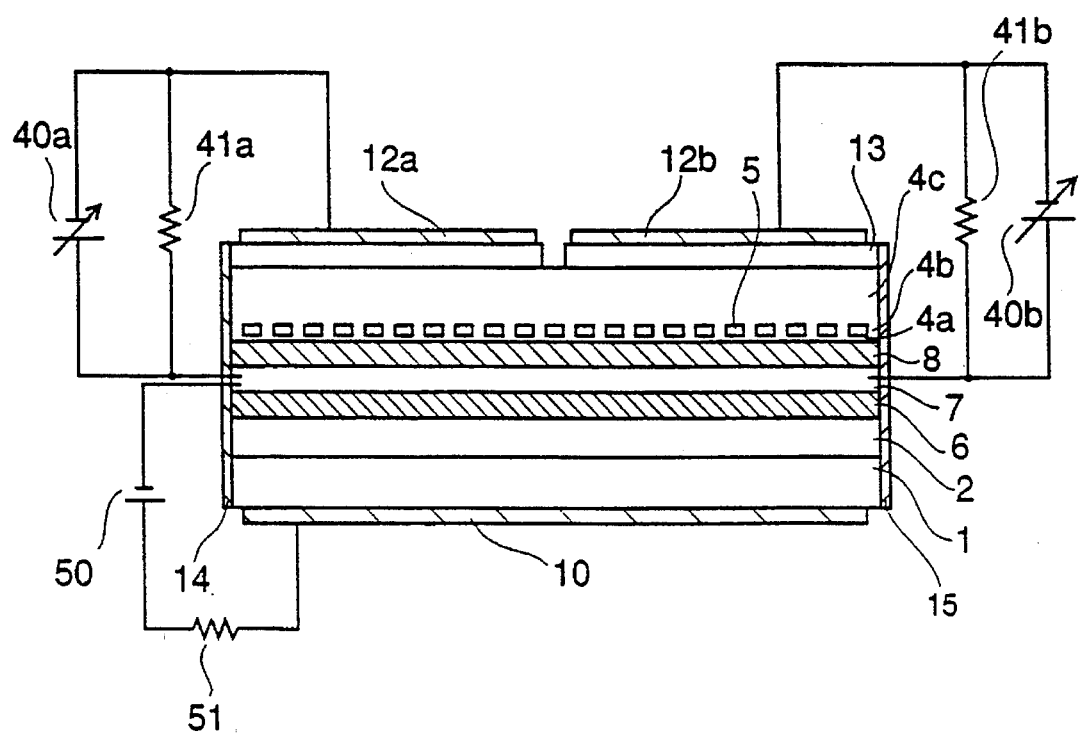
FIG. 1 is a diagram for explaining structure and operation of a wavelength tunable semiconductor laser device in accordance with a first embodiment of the present invention.
Figure 2:
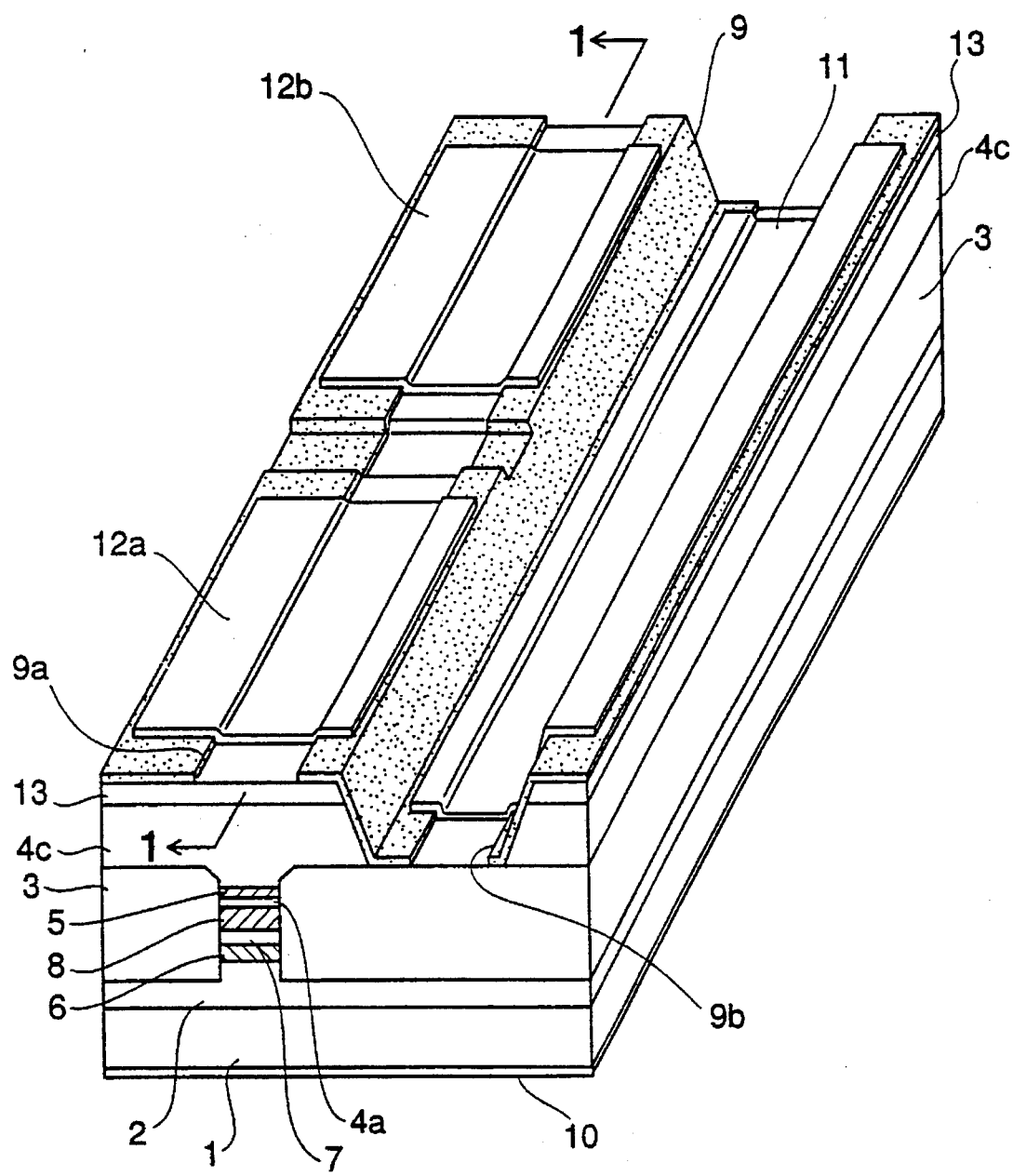
FIG. 2 is a perspective view of the wavelength tunable semiconductor laser device of FIG. 1 according to the first embodiment of the invention.

FIG. 1 is a diagram for explaining structure and operation of a wavelength tunable semiconductor laser device in accordance with a first embodiment of the present invention. FIG. 2 is a perspective view of the wavelength tunable semiconductor laser device. FIG. 1 shows a cross section taken along a line 1—1 in FIG. 2.

In these figures, reference numeral 1 designates a p type InP substrate. A first p type InP buffer layer 2 is disposed on the substrate 1. The first p type InP buffer layer 2 has a stripe-shaped ridge portion. An InGaAsP active layer 6 having an MQW (multiquantum well) structure and an oscillation wavelength of 1.55 μm is disposed on the ridge portion of the buffer layer 2. An n type InP spacer layer 7 is disposed on the active layer 6. A tuning layer 8 comprising InGaAsP in a composition having a band gap energy equivalent wavelength λg of 1.4 μm is disposed on the spacer layer 7. A p type InP guide layer 4a is disposed on the tuning layer 8. An InGaAsP diffraction grating 5 comprising a plurality of stripes is disposed on the guide layer 4a. A second p type InP buffer layer 4b is disposed on the p type InP guide layer 4a to bury the stripes of the diffraction grating 5. A third p type InP buffer layer 4c is disposed on the second p type InP buffer layer 4b and on the diffraction grating 5. A p type InGaAsP contact layer 13 is disposed on the third p type InP buffer layer 4c. P side electrodes 12a and 12b for applying an electric field to the tuning layer 8 (hereinafter also called tuning electrodes) are disposed on the contact layer 13. A portion of the contact layer 13 between the tuning electrodes 12a and 12b is removed to electrically isolate these electrodes from each other. A p side electrode 10 for driving the laser is disposed on the rear surface of the substrate 1. An AR coating layer 14 having a low reflectivity is disposed on a front facet of the laser, i.e., a laser emitting facet. An HR coating layer 15 having a high reflectivity is disposed on a rear face of the laser.

A description is given of the production process.

Initially, the first p type InP buffer layer 2, the InGaAsP active layer 6, the n type InP spacer layer 7, the InGaAsP tuning layer 8, the p type InP guide layer 4a, and the InGaAsP diffraction grating layer 5 are successively grown on the p type InP substrate 1 using MOVPE. Then, the diffraction grating layer 5 is patterned into a plurality of stripes periodically arranged in what becomes the resonator length direction, i.e., the light propagating direction, using photolithography and etching. Thereafter, the second p type InP buffer layer 4b is grown on the patterned diffraction grating layer 5 to bury the stripes. Then, an $SiO_2$ film (not shown) is deposited on the second p type InP buffer layer 4b by sputtering and patterned in a stripe shape extending in the resonator length direction of the laser, using photolithography and RIE. Using the stripe-shaped $SiO_2$ film as a mask, the semiconductor laminated structure is selectively etched from the second p type InP buffer layer 4b to the p type InP buffer layer 2, forming a ridge-shaped waveguide (hereinafter referred to as a ridge waveguide) in which the width of the active layer is 1.2 μm. Using the stripe-shaped $SiO_2$ film as a mask for selective growth, the n type InP layer 3 is grown on the first p type InP buffer layer 2 contacting opposite sides of the ridge waveguide. After removal of the $SiO_2$ mask, the third p type InP buffer layer 4c is grown on the n type InP layer 3 and on the p type InP buffer layer 4b and, successively, the p type InGaAsP contact layer 13 is grown on the buffer layer 4c.

Next, prescribed portions of the contact layer 13 and the third p type InP buffer layer 4c are removed to expose the surface of the n type InP layer 3. Then, a portion of the contact layer 13 opposite the ridge waveguide is removed to electrically separate a region where the first tuning electrode 12a is later formed from a region where the second tuning electrode 12b is later formed. Alternatively, this electrical separation between these regions may be achieved by forming a groove in a prescribed portion of the buffer layer 4c by etching and filling the groove with Fe-doped InP or the like.

Thereafter, an insulating film 9 comprising $SiO_2$ is deposited over the entire surface of the wafer and patterned to form an opening 9a exposing the surface of the p type InGaAsP contact layer 13 opposite the ridge waveguide and an opening 9b exposing the surface of the n type InP layer 3. Then, the tuning electrodes 12a and 12b are formed in contact with the exposed surface of the p type InGaAsP contact layer 210, and the n side electrode 11 is formed in contact with the exposed surface of the n type InP layer 3. In addition, the p side electrode 10 for driving the laser is formed on the rear surface of the p type InP substrate 1. Finally, laser facets are formed by cleaving, and the AR coating layer 14 and the HR coating layer 15 are formed at the opposite front and rear facets, respectively, completing the laser element of the wavelength tunable semiconductor laser according to the first embodiment of the invention.

A description is given of the operation.

In the structure shown in FIG. 1, a laser driving current is injected into the active layer 6 when a bias voltage in a forward direction is applied from the laser driving power supply 50 across the n side electrode 11 and the laser driving p side electrode 10. On the other hand, an electric field $E_f$ is applied to a region of the tuning layer 8 adjacent to the front facet of the laser with the AR coating layer 14 when a voltage is applied from the first variable voltage supply 41a across the n side electrode 11 and the tuning electrode 12a. An electric field $E_r$ is applied to a region of the tuning layer 8 adjacent to the rear facet with the HR coating layer 15 when a voltage is applied from the second variable voltage supply 41b across the n side electrode 11 and the tuning electrode 12b.

By the way, in a semiconductor laser with asymmetric AR/HR coatings, the threshold carrier concentration of the whole resonator differs from a case where the absorption loss occurs at the AR coating side and a case where the absorption loss occurs at the HR coating side. Generally, the threshold carrier concentration is lower when the absorption loss occurs at the AR coating side than when the absorption loss occurs at the HR coating side. The reason is as follows. That is, light traveling toward the facet with the AR coating is hardly reflected at the facet before it is emitted from the facet, so that the light is subjected to absorption only once at the AR coating side. However, most of light traveling toward the facet with the HR coating is reflected at the facet, so that the light is subjected to absorption twice on the HR coating side. Therefore, the absorption loss is higher at the facet with the HR coating than at the facet with the AR coating.

In this first embodiment of the invention, when wavelength tuning is performed by applying an electric field to the tuning layer 8, initially, a voltage is applied from the second variable voltage supply 41b across the n side electrode 11 and the tuning electrode 12b to apply the electric field $E_r$ to the region of the tuning layer 8 adjacent to the HR coating layer 15 and, thereafter, a voltage is applied from the first variable voltage supply 41a across the n side electrode 11 and the tuning electrode 12a to apply the electric field $E_f$ to the region of the tuning layer 8 adjacent to the AR coating layer 14. The electric field $E_r$ is gradually reduced as electric field $E_f$ is increased so that the absorption loss in the whole resonator is maintained constant. Thereby, a negative variation in refractive index due to an increase in absorption loss caused by the application of an electric field as described in Applied Physics Letters 59(21), 18 Nov. 1991 and Applied Physics Letters 60(20), 18 May 1992 is avoided.

As described above, when the electric fields $E_r$ and $E_f$ are applied to the tuning layer 8 while appropriately controlling the ratio of the electric field $E_r$ on the HR coating layer 15 side to the electric field $E_f$ on the AR coating layer 14 side, the total strength of the electric fields $(E_r+E_f)$ applied to the tuning layer 8 can be increased without changing the absorption loss in the whole resonator, whereby the variation in the threshold carrier concentration due to the application of the electric field is suppressed. Therefore, the negative variation in refractive index due to the plasma effect is suppressed, and the positive variation in refractive index due to the application of the electric fields $E_r$ and $E_f$ to the tuning layer 8 is not canceled by the negative variation in refractive index, resulting in a wide wavelength tunable range.

As described above, according to the first embodiment of the present invention, in the electric field applied type TTG semiconductor laser device in which the active layer 6 and the tuning layer 8 are individually controlled and an electric field is applied to the tuning layer 8 to tune the wavelength, the asymmetrical facet coating structure is employed, i.e., the AR coating layer 14 and the HR coating layer 15 are disposed on the opposite front and rear facets of the laser, respectively, and an electrode for applying an electric field to the tuning layer 8 is divided into the first and second tuning electrodes 12a and 12b so that different electric fields $E_f$ and $E_r$ are separately applied to the AR coating side region of the tuning layer and the HR coating side region of the tuning layer from these electrodes 12a and 12b, respectively. Therefore, by controlling the electric fields applied to the respective regions of the tuning layer 8, the total electric field applied to the tuning layer is increased while maintaining the absorption loss of the whole resonator constant, whereby the positive variation in refractive index due to the application of the electric field to the tuning layer 8 can be achieved without being diminished by the negative variation in refractive index. As a result, the wavelength of light produced in the active layer 6 can be tuned in a wide range without increasing spectral width.

While in the above-described first embodiment the tuning electrode is divided into two, it may be divided into three or more for more precise control.

While in the above-described first embodiment emphasis has been placed upon a semiconductor laser employing an InP substrate, a similar structure employing a GaAs substrate and comprising other III–V compound semiconductor materials is within the scope of the invention.

Embodiment 2

Figure 3:
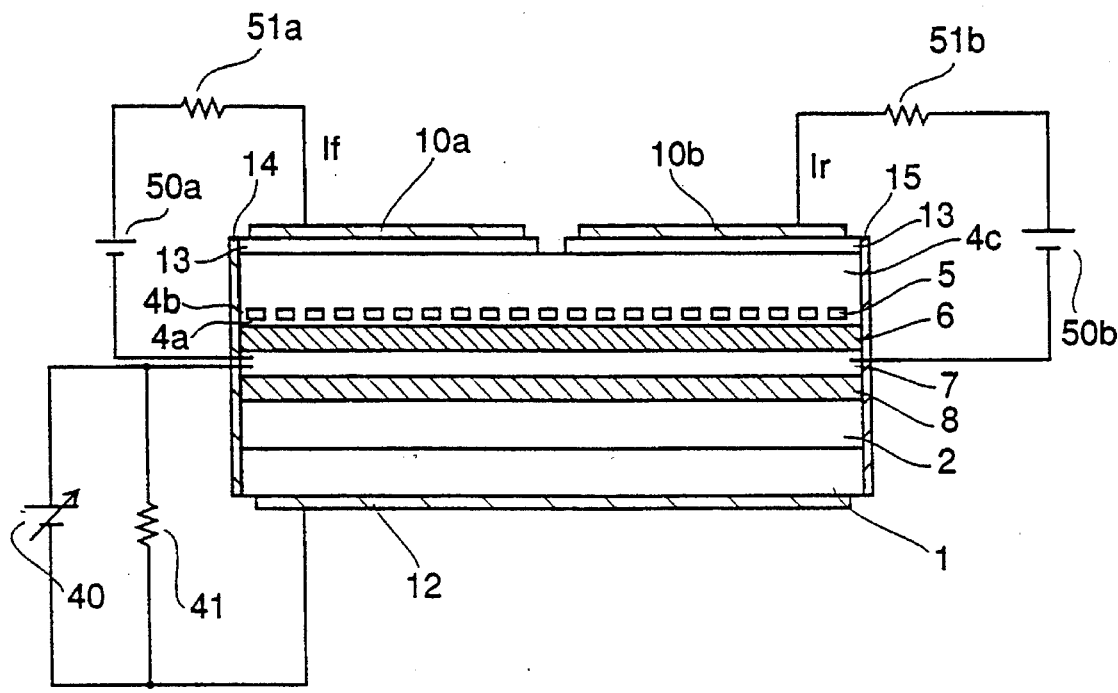
FIG. 3 is a diagram for explaining structure and operation of a wavelength tunable semiconductor laser device in accordance with a second embodiment of the present invention.
Figure 5:
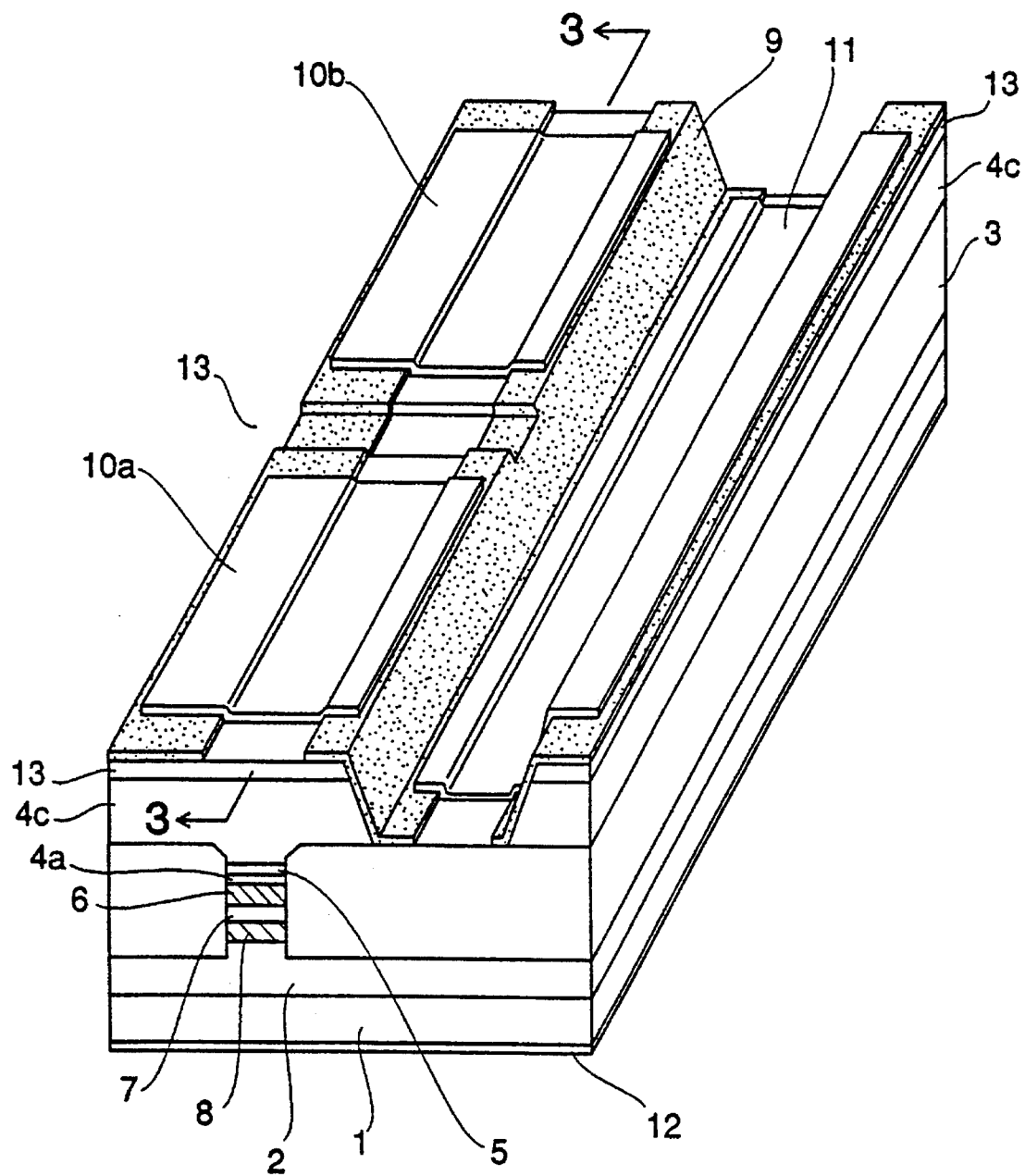
FIG. 5 is a perspective view of the wavelength tunable semiconductor laser device of FIG. 4 according to the second embodiment of the invention.

FIG. 3 is a diagram for explaining structure and operation of a wavelength tunable semiconductor laser device according to a second embodiment of the invention. FIG. 5 is a perspective view of the wavelength tunable semiconductor laser device. More specifically, FIG. 3 shows a cross section taken along a line 3—3 in FIG. 5. In these figures, the same reference numerals as in FIGS. 1 and 2 designate the same or corresponding parts. A first laser driving p side electrode 10a is located opposite a region of the active layer 6 adjacent to the front facet of the laser with the AR coating layer 14, and a second laser driving p side electrode 10b is located opposite a region of the active layer adjacent to the rear facet of the laser with the HR coating layer 15. A tuning electrode 12 is disposed on the rear surface of the substrate 1.

In this second embodiment, the active layer 6 and the tuning layer 8 in the first embodiment of the invention are interchanged, and a laser driving p side electrode is divided into two electrodes which individually apply current to the front facet side region of the active layer and the rear facet side region of the active layer.

The fabricating process of the wavelength tunable semiconductor laser device according to this second embodiment is fundamentally identical to the fabricating process already described with respect to the first embodiment except that the semiconductor layers are successively grown on the substrate 1 in the order of the buffer layer 2, the tuning layer 8, the spacer layer 7, the active layer 6, the guide layer 4a, and the diffraction grating layer 5 whereas these layers are grown in the order of the buffer layer 2, the active layer 6, the spacer layer 7, the tuning layer 8, the guide layer 4a, and the diffraction grating layer 5 in the first embodiment of the invention.

A description is given of the operation. A laser driving current If is applied from the first driving power supply 50a to the region of the active layer 6 adjacent to the front facet of the laser with the AR coating layer 14, and a laser driving current $I_r$ is applied from the second driving power supply 50b to the region of the active layer 6 adjacent to the rear facet of the laser with the HR coating layer 15. An electric field is applied to the tuning layer 8 comprising InGaAsP having a composition with an energy band gap equivalent to a wavelength λg of 1.4 µm when a voltage is applied from the variable voltage supply 40 across the n side electrode 11 and the tuning electrode 12.

Figure 4:
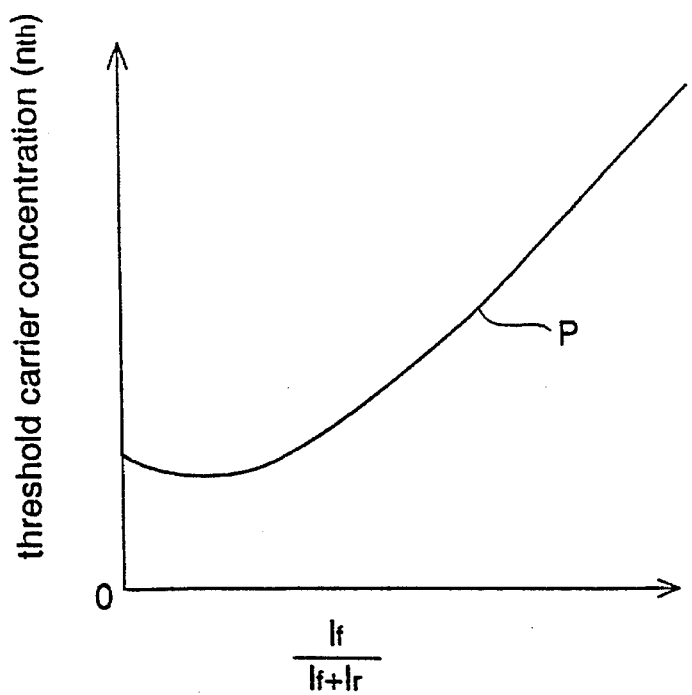
FIG. 4 is a graph showing a relationship between the threshold carrier concentration of the whole resonator and the ratio of laser driving current $I_f$ applied to a region of an active layer adjacent to an AR coating to the total of laser driving current injected into the active layer, according to the second embodiment of the invention.

In the semiconductor laser device with the asymmetrical AR/HR coatings, it is possible to vary the threshold carrier concentration of the whole resonator by varying the ratio of the laser driving current $I_f$ applied to the AR coating side region of the active layer to the laser driving current $I_r$ applied to the HR coating side region of the active layer. FIG. 4 is a graph illustrating a relationship between the threshold carrier concentration of the whole resonator and the ratio of the laser driving current $I_f$ applied to the AR coating side region of the active layer to the total laser driving current $I_f+I_r$ applied to the entire active layer. As can be seen from FIG. 4, the threshold carrier concentration can be reduced by reducing the ratio of $I_f$ to $I_f+I_r$.

Accordingly, when the ratio of the laser driving currents $I_f$ and $I_r$ injected into the active layer 6 is varied to reduce the injected current ratio $I_f/I_f+I_r$ as the electric field is applied to the tuning layer 8, the increase in the threshold carrier concentration with the increase in the absorption loss due to the application of the electric field to the tuning layer 8 is prevented, whereby the negative variation in refractive index due to the plasma effect is avoided. Therefore, the positive variation in refractive index caused by the application of the electric field to the tuning layer 8 is achieved without being diminished by the negative variation of refractive index, resulting in a wide wavelength tunable range.

As described above, according to the second embodiment of the present invention, in the electric field applied type TTG semiconductor laser device in which the active layer 6 and the tuning layer 8 are individually controlled and an electric field is applied to the tuning layer 8 to tune the wavelength, the asymmetrical facet coating structure is employed, i.e., the AR coating layer 14 and the HR coating layer 15 are disposed on the front and rear facets of the laser, respectively, and an electrode for applying current to the active layer 6 is divided into the first and second laser driving p side electrodes 10a and 10b so that different currents $I_f$ and $I_r$ are separately applied to the region of the active layer 6 adjacent to the AR coating layer 14 and the region of the active layer 6 adjacent to the HR coating layer 15, respectively. Therefore, when laser emission and wavelength tuning are carried out so that the ratio of the current applied to the AR coating 14 side region of the active layer 6 to the laser driving current applied to the entire active layer 6 is reduced as the electric field is applied to the tuning layer 8, the negative variation in refractive index due to an increase in the absorption loss of the electric field applied type TTG structure is avoided, resulting in a wavelength tunable laser device that provides narrow spectra in a wide wavelength range.

While in the above-described second embodiment the laser driving electrode is divided into two, i.e., the first and second p side electrodes 10a and 10b, it may be divided into three or more in the resonator length direction for more precise control.

While in the above-described second embodiment emphasis has been placed upon a semiconductor laser employing an InP substrate, a similar structure employing a GaAs substrate and comprising other III–V compound semiconductor materials is within the scope of the invention.

Embodiment 3

Figure 6:
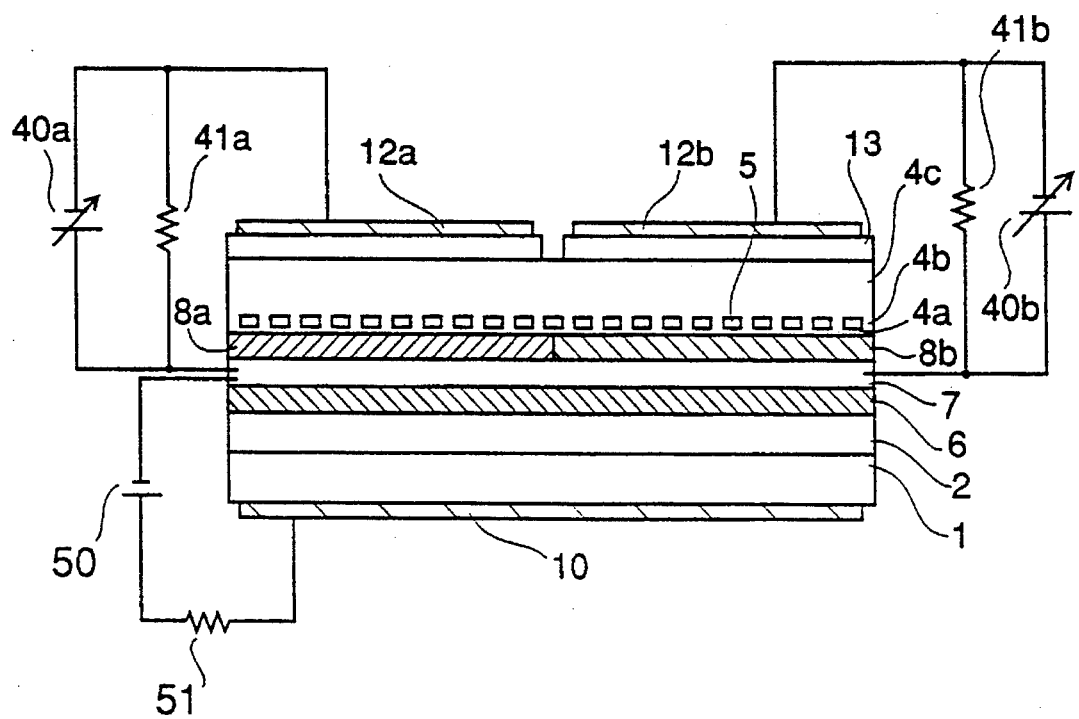
FIG. 6 is a diagram for explaining structure and operation of a wavelength tunable semiconductor laser device in accordance with a third embodiment of the present invention.
Figure 8:
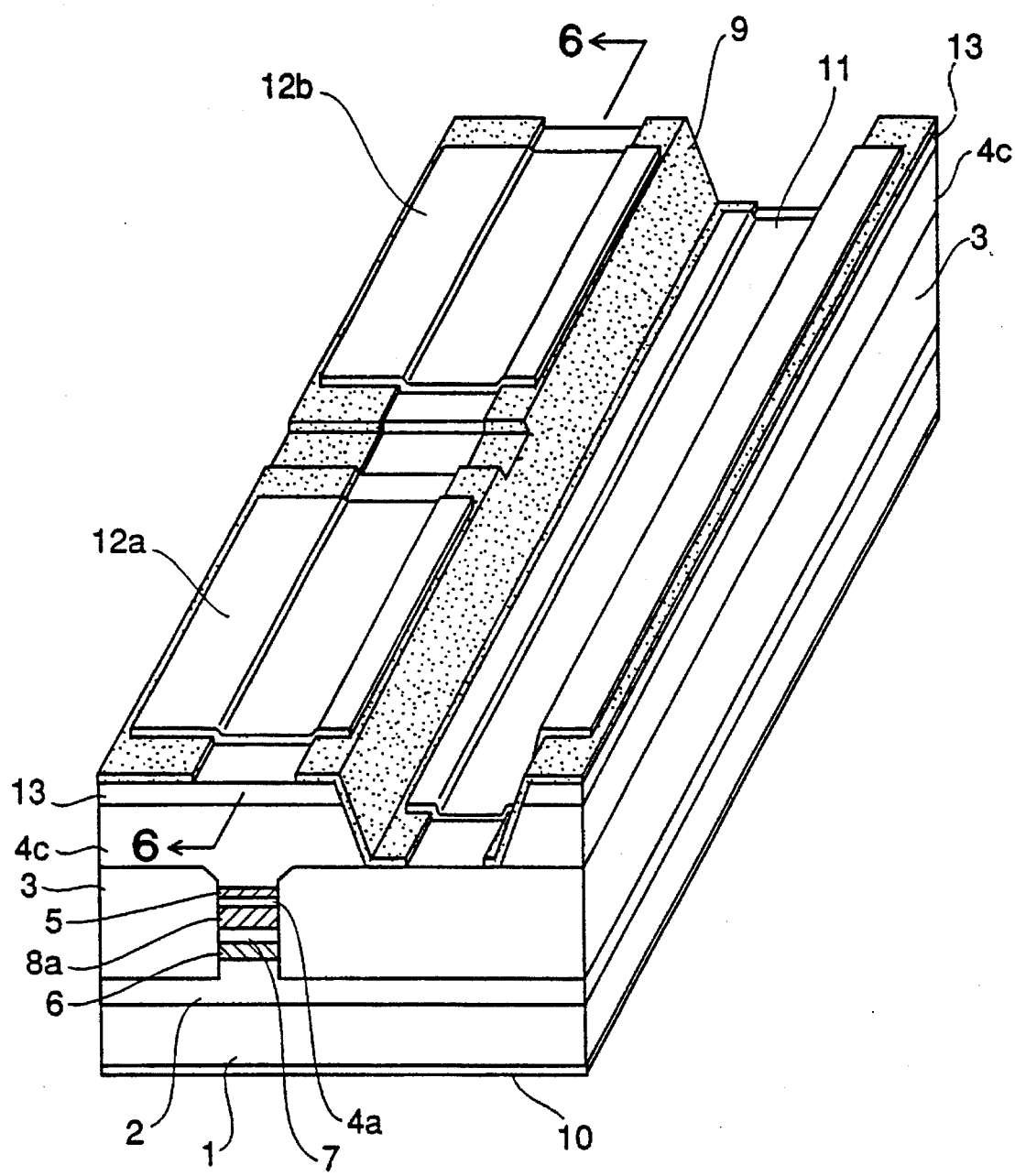
FIG. 8 is a perspective view of the wavelength tunable semiconductor laser device of FIG. 6 according to the third embodiment of the invention.

FIG. 6 is a diagram for explaining structure and operation of a wavelength tunable semiconductor laser device in accordance with a third embodiment of the present invention. FIG. 8 is a perspective view of the wavelength tunable semiconductor laser device. More specifically, FIG. 6 shows a cross section taken along a line 6—6 in FIG. 8. In these figures, the same reference numerals as in FIGS. 1 and 2 designate the same or corresponding parts. Reference numeral 8a designates a first tuning layer comprising InGaAsP having a composition with an energy band gap equivalent to a wavelength λg of 1.4 μm, and numeral 8b designates a second tuning layer comprising InGaAsP having a composition with an energy band gap equivalent to a wavelength λg of 1.5 μm.

Figure 7:
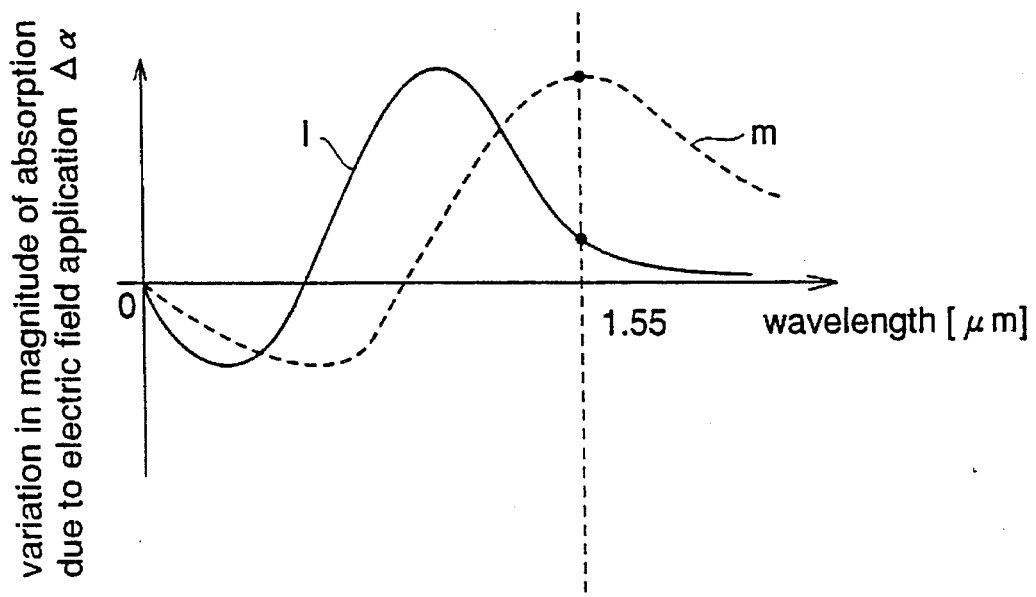
FIGS. 7(a) and 7(b) are graphs illustrating variations in magnitude of absorption and variations in refractive index, respectively, when an electric field is applied to first and second tuning layers in the structure of FIG. 6 according to the third embodiment of the invention.
Figure 7:
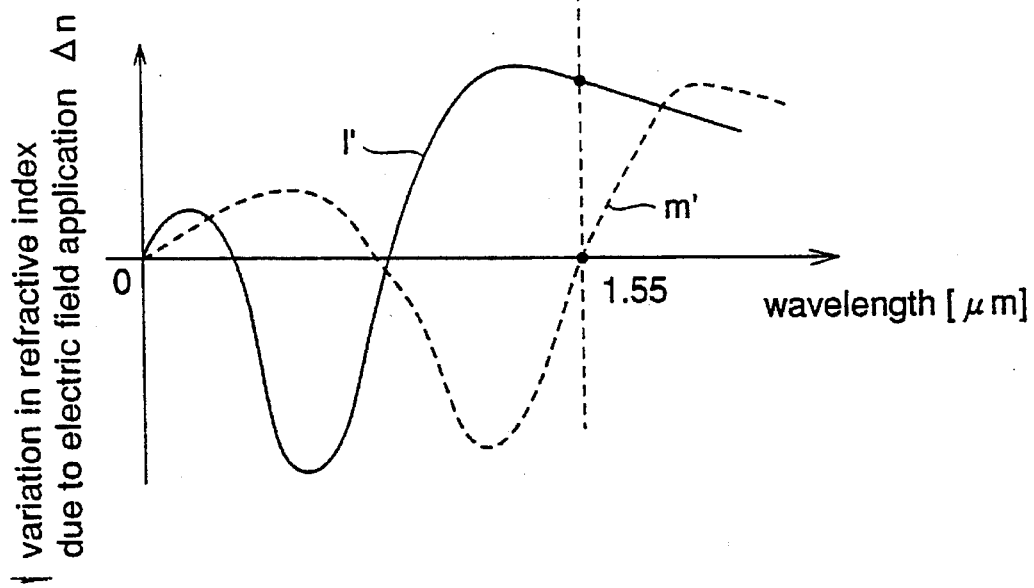

FIGS. 7(a) and 7(b) are graphs illustrating variations in magnitude of absorption and in refractive index, respectively, when an electric field is applied to the first and second tuning layers 8a and 8b. As shown in these figures, as a result of the application of electric field, the first tuning layer 8a has a relatively large variation in refractive index Δn (l' in FIG. 7(b)) and a relatively small variation in the magnitude of absorption Δα (I in FIG. 7(a)) to the light having a wavelength of 1.55 μm. On the other hand, as a result of the application on electric field, the second tuning layer 8b has a relatively small variation in refractive index Δn (m' in FIG. 7(b)) and a relatively large variation in the magnitude of absorption Δα (m in FIG. 7(a)) to the light having a wavelength of 1.55 μm.

A description is given of the operation. A laser driving current is supplied from the laser driving current supply 50 and injected into the active layer 6 through the n side electrode 11 and the laser driving p side electrode 10. An electric field is applied to the tuning layer 8a by applying a voltage from the first variable voltage supply 41a across the n side electrode 11 and the tuning electrode 12a. On the other hand, an electric field is applied to the tuning layer 8b by applying a voltage from the second variable voltage supply 41b across the n side electrode 11 and the tuning electrode 12b.

Initially, a prescribed electric field is applied to the tuning layer 8b while no electric field is applied to the tuning layer 8a and, in this state, a current is injected into the active layer 6 to cause oscillation of the laser at a wavelength of 1.55 μm.

Since the second tuning layer 8b has the characteristic shown by the dotted line m in FIG. 7(a), the laser light having a wavelength of 1.55 μm is absorbed to some degree in the second tuning layer 8b.

Then, using the first variable voltage supply 41a, an electric field is applied to the first tuning layer 8a. In response to the strength of the electric field applied to the first tuning layer 8a, the strength of the electric field applied to the second tuning layer 8b is decreased so that the absorption loss of the whole resonator to the laser light produced in the active layer 6 does not change. Thereby, the negative variation in refractive index due to an increase in the absorption loss caused by the electric field application as described in Applied Physics Letters 59(21), 18 Nov. 1991 and Applied Physics Letters 60(20), 18 May 1992 is avoided.

Since the second tuning layer 8b has the refractive index variation characteristic shown by the dotted line m' in FIG. 7(b), the reduction in the electric field strength applied to the second tuning layer. 8b hardly causes the negative variation in refractive index of the second tuning layer 8b at the wavelength of 1.55 μm.

Accordingly, the positive variation in refractive index Δn at the oscillation wavelength of 1.55 μm due to the application of an electric field to the first tuning layer 8a having the refractive index variation characteristic shown by the continuous line 1' in FIG. 7(b) is achieved without being canceled, whereby an unwanted reduction in the wavelength tunable range is suppressed.

As described above, according to the third embodiment of the present invention, in the electric field applied type TTG semiconductor laser device in which the active layer and the tuning layer are individually controlled and an electric field is applied to the tuning layer to tune the wavelength, the tuning layer comprises the first tuning layer 8a and the second tuning layer 8b having different characteristics, and these tuning layers 8a and 8b are provided with electrically separated first and second p side electrodes 12a and 12b, respectively. Therefore, when the absorption loss to the laser light produced in the active layer 6 caused by the application of an electric field to the first tuning layer 8a is controlled in response to the strength of the electric field applied to the second tuning layer 8b so that the absorption loss of the whole resonator does not change, the negative variation in refractive index due to the variation in absorption magnitude is avoided, whereby a wide wavelength tunable range as a result of the positive variation in refractive index of the first tuning layer 8a is maintained. As a result, a wavelength tunable semiconductor laser device that can tune a wavelength having narrow spectra in a wide range is realized.

The first and second tuning layers 8a and 8b may comprise bulk layers or MQW layers as long as the first tuning layer 8a has, as a result of the application of electric field, a relatively large refractive index variation Δn and a relatively small absorption magnitude variation Δα to the light generated in the active layer and the second tuning layer 8b has, as a result of the application of electric field, a relatively small refractive index variation Δn and a relatively large absorption magnitude variation Δα to the light generated in the active layer.

As described above, the first and second tuning layers 8a and 8b must have different characteristics. These layers are fabricated by growing two layers of different material compositions in separate crystal growth steps. Alternatively, MQW tuning layers 8a and 8b may be grown simultaneously in a selective growth using a mask pattern in which the ratio of masked portion to unmasked portion where the tuning layer is later grown differs between a region where the first tuning layer 8a is later grown and a region where the second tuning layer 8b is later grown. In the latter case, since the thicknesses of grown layers constituting the MQW structure differ between the tuning layer 8a and the tuning layer 8b, the characteristics of these tuning layers 8a and 8b differ from each other.

While in the above-described third embodiment emphasis is placed upon a wavelength tunable semiconductor laser including two tuning layers which are individually controlled, a similar structure including three or more tuning layers which are individually controlled is within the scope of the present invention.

While in the above-described third embodiment emphasis has been placed upon a semiconductor laser employing an InP substrate, a similar structure employing a GaAs substrate and comprising other III–V compound semiconductor materials is within the scope of the invention.

Embodiment 4

Figure 9:
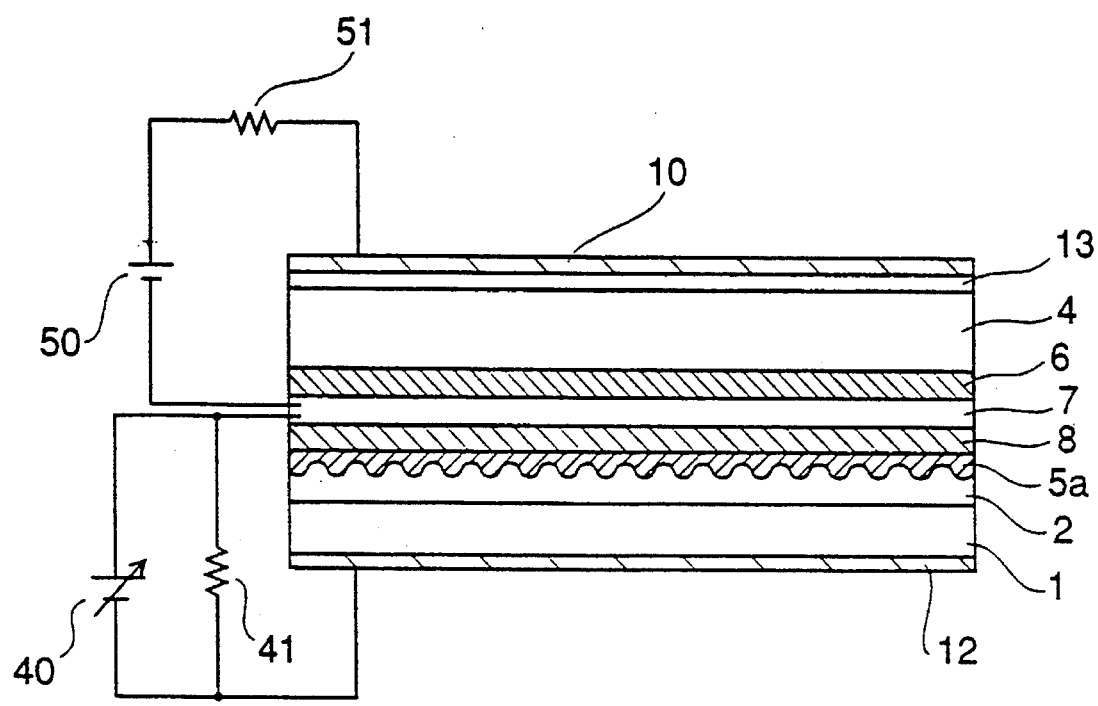
FIG. 9 is a diagram for explaining structure and operation of a wavelength tunable semiconductor laser device in accordance with a fourth embodiment of the present invention.

FIG. 9 is a diagram for explaining a wavelength tunable semiconductor laser device in accordance with a fourth embodiment of the present invention. In FIG. 9, the same reference numerals as in FIGS. 1 and 3 designate the same or corresponding parts. Reference numeral 5a designates a diffraction grating layer having a composition with a band gap energy equivalent to a wavelength λg of 1.4 µm and a pitch of 2400Å. This diffraction grating layer 5a is fabricated on the first p type InP buffer layer 2 and, thereafter, the tuning layer 8 is grown thereon. The diffraction grating layer 5a may be a bulk layer or an MQW layer.

A description is given of the operating principle.

In the wavelength tunable semiconductor laser device according to this fourth embodiment of the invention, an electric field is applied to the diffraction grating layer 5a simultaneously with the application of electric field to the tuning layer 8. When an electric field is applied to the diffraction grating layer 5a, the refractive index of the diffraction grating layer 5a is increased and the coupling constant k of the diffraction grating is increased. Since the reflectivity of light by the diffraction grating layer 5a increases with the increase in the coupling constant k, the reflection loss due to the diffraction grating mirror is reduced. Accordingly, in this fourth embodiment, the increase in the absorption loss due to the application of electric field to the tuning layer 8 is canceled by the reduction in the reflection loss due to the simultaneous application of an electric field to the diffraction grating layer 5a.

As described above, according to this fourth embodiment of the invention, in the wavelength tunable semiconductor laser device that tunes the oscillation wavelength in response to application of an electric field to the tuning layer adjacent to the active layer, the increase in the absorption loss in the tuning layer 8 due to the application of an electric field is canceled by the reduction in the reflection loss due to the application of an electric field to the diffraction grating layer 5a, whereby a wavelength tunable semiconductor laser device with a wide wavelength tunable range is realized.

While in the above-described third embodiment emphasis has been placed upon a semiconductor laser employing an InP substrate, a similar structure employing a GaAs substrate and comprising other III–V compound semiconductor materials is within the scope of the invention.

Embodiment 5

Figure 10:
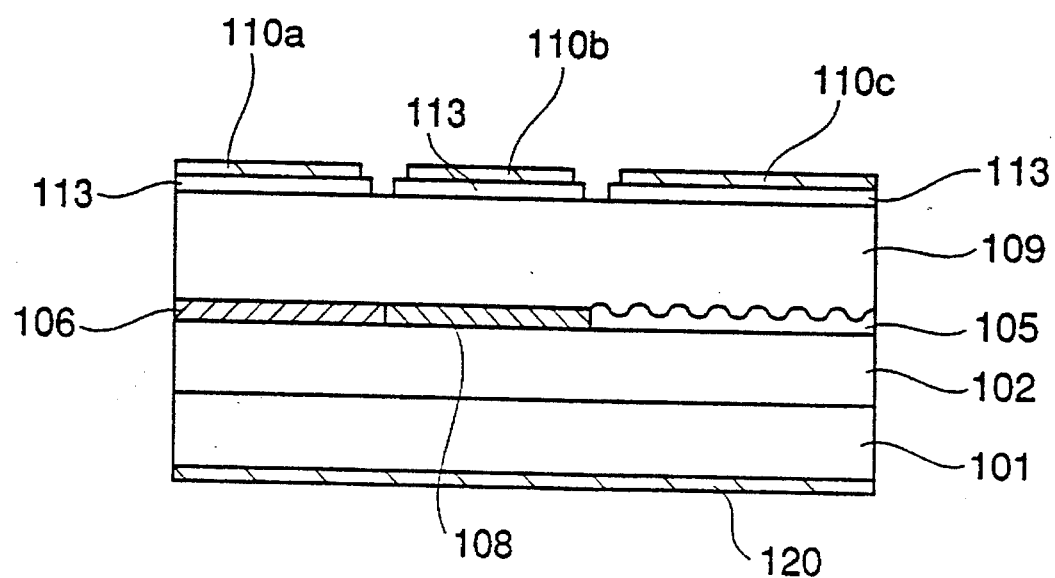
FIG. 10 is a diagram for explaining structure and operation of a wavelength tunable semiconductor laser device in accordance with a fifth embodiment of the present invention.

FIG. 10 is a diagram for explaining a wavelength tunable semiconductor laser device in accordance with a fifth embodiment of the present invention. In the figure, reference numeral 101 designates a p type semiconductor substrate. A p type semiconductor buffer layer 102 is disposed on the substrate 101. A diffraction grating layer 105, an active layer 106, and a tuning layer 108 are disposed on prescribed regions of the buffer layer 102. An n type semiconductor buffer layer 109 is disposed on the above-described layers 105, 106, and 108. An n type semiconductor contact layer 113 is disposed on the buffer layer 109. An n side electrode 110a for driving the laser, an n side electrode 110b for wavelength tuning, and an n side electrode 110c for applying an electric field to the diffraction grating are disposed on the contact layer 113 opposite the active layer 106, the tuning layer 108, and the diffraction grating layer 105, respectively. A common p side electrode 120 is disposed on the rear surface of the substrate 101.

In this fifth embodiment of the invention, as in the above-described fourth embodiment, an increase in the absorption loss due to the application of an electric field to the tuning layer is canceled by a reduction in the reflection loss due to the application of an electric field to the diffraction grating. However, the semiconductor laser according to this fifth embodiment employs, for the resonator structure, is not a TTG structure as described in the fourth embodiment but a DBR (Distributed Bragg Reflector) structure shown as in FIG. 10.

More specifically, the electrically separated n side electrodes 110a, 110b, and 110c are disposed opposite the active layer 106, the tuning layer 108, and the diffraction grating layer 105, respectively. The wavelength of light generated in the active layer 106 is varied according to the variation in refractive index of the tuning layer 108 due to the application of electric field to the tuning layer 108, and the increase in the absorption loss due to the application of the electric field to the tuning layer 108 is canceled by the reduction in the reflection loss due to the application of the electric field to the diffraction grating layer 105. Also in this fifth embodiment, a wide wavelength tunable range is obtained as in the above-described fourth embodiment.

Embodiment 6

Figure 11:
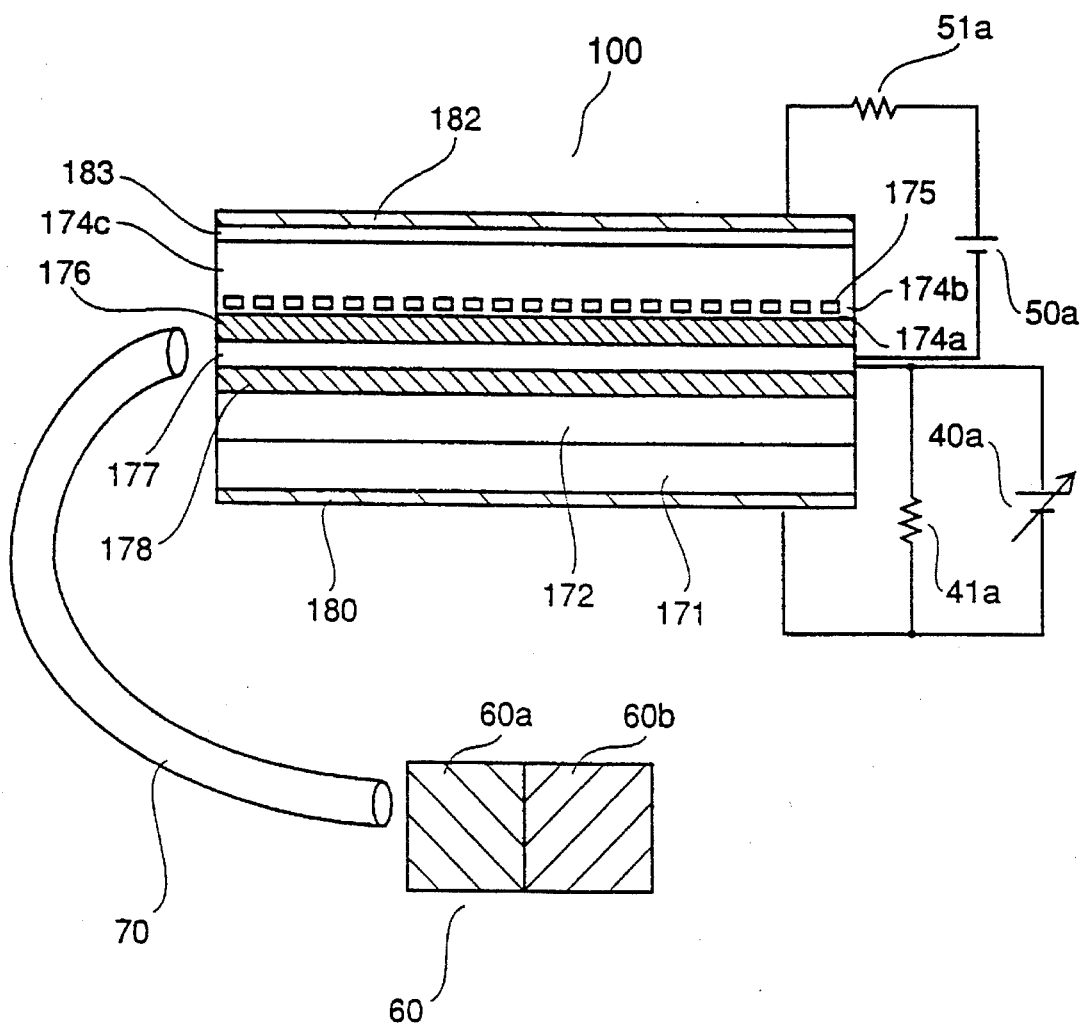
FIG. 11 is a diagram for explaining structure and operation of a wavelength tunable semiconductor laser device in accordance with a sixth embodiment of the present invention.
Figure 19:
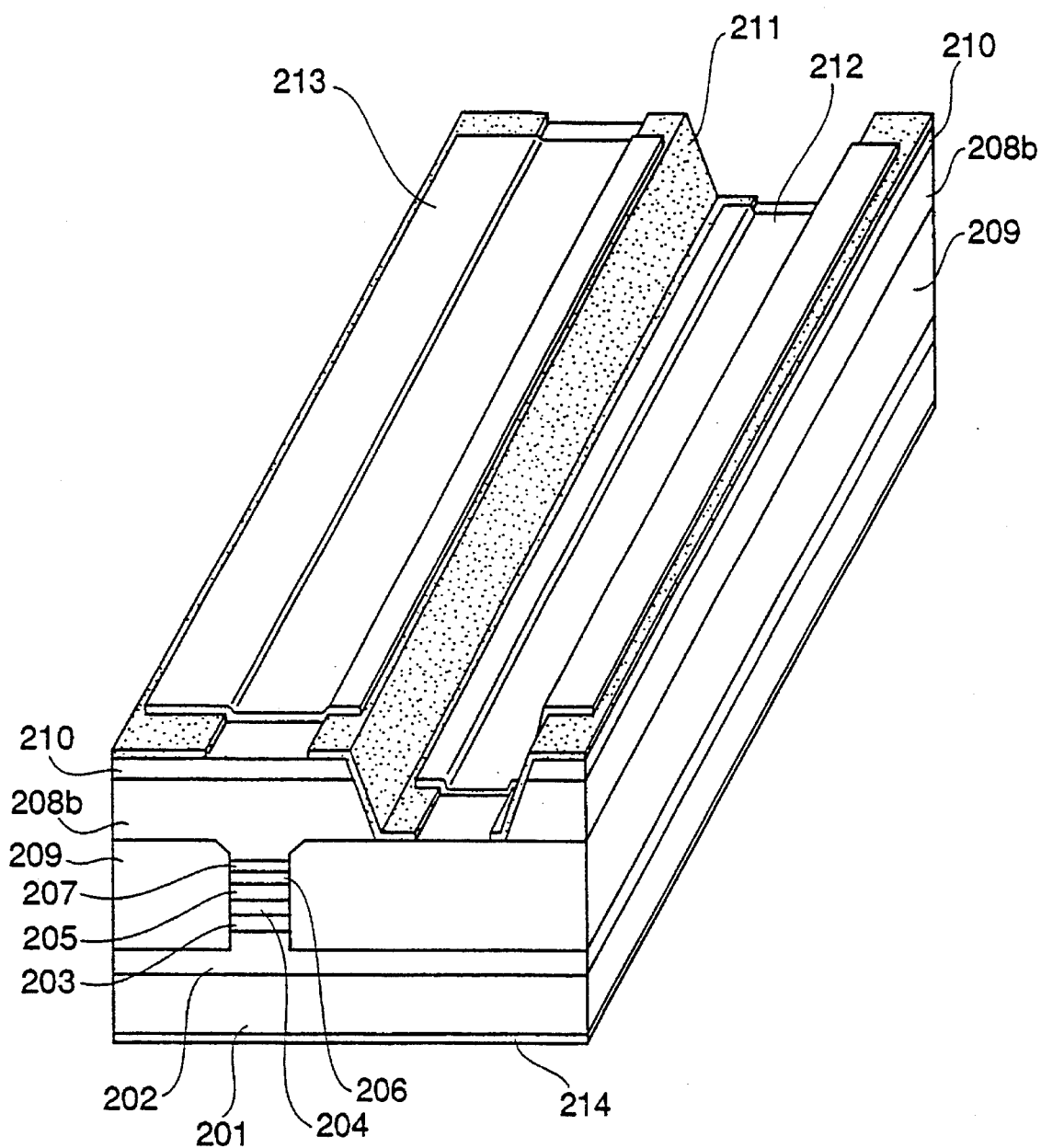
FIG. 19 is a perspective view illustrating a TTG semiconductor laser device according to the prior art.
Figure 20:
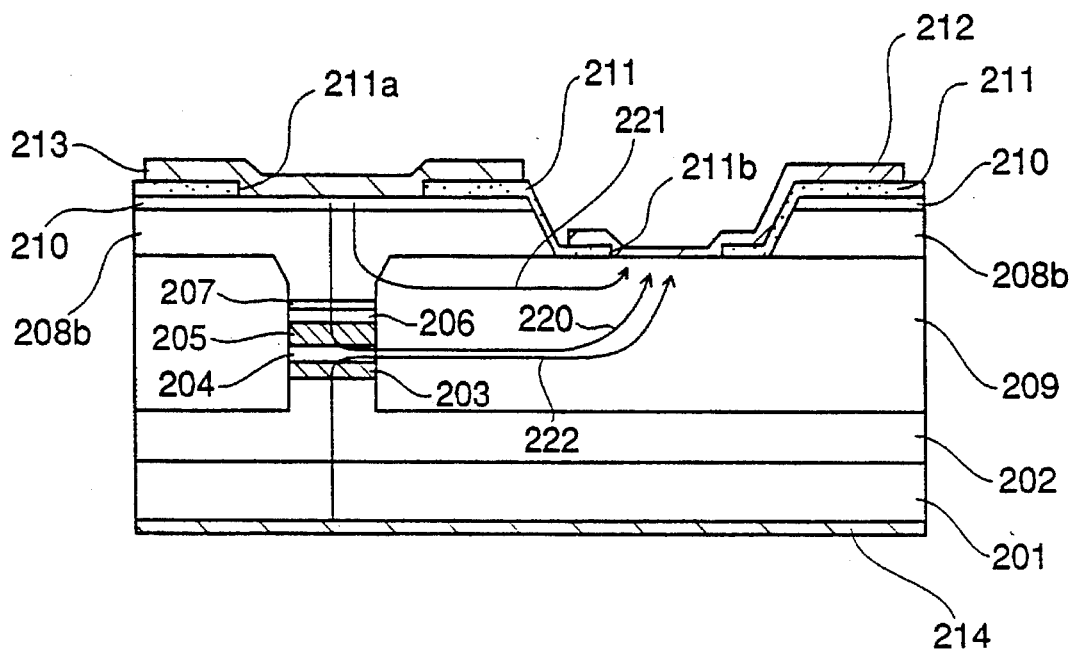
FIG. 20 is a diagram for explaining operation of a current injected type TTG semiconductor laser device according to the prior art.
Figure 21:
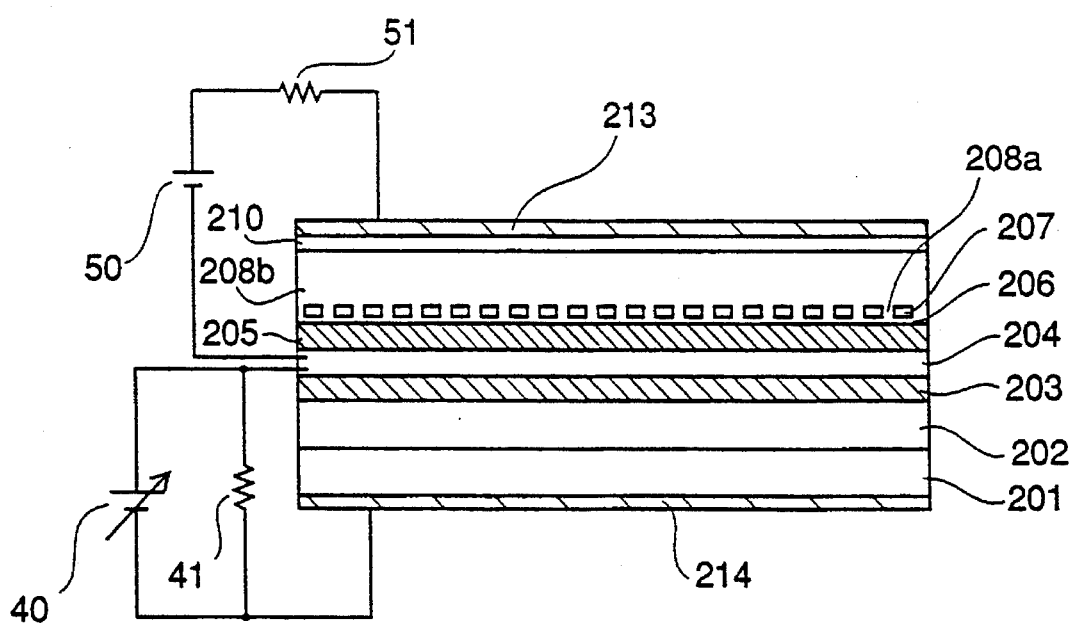
FIG. 21 is a diagram for explaining operation of an electric field applied type TTG semiconductor laser device according to the prior art.
Figure 22:
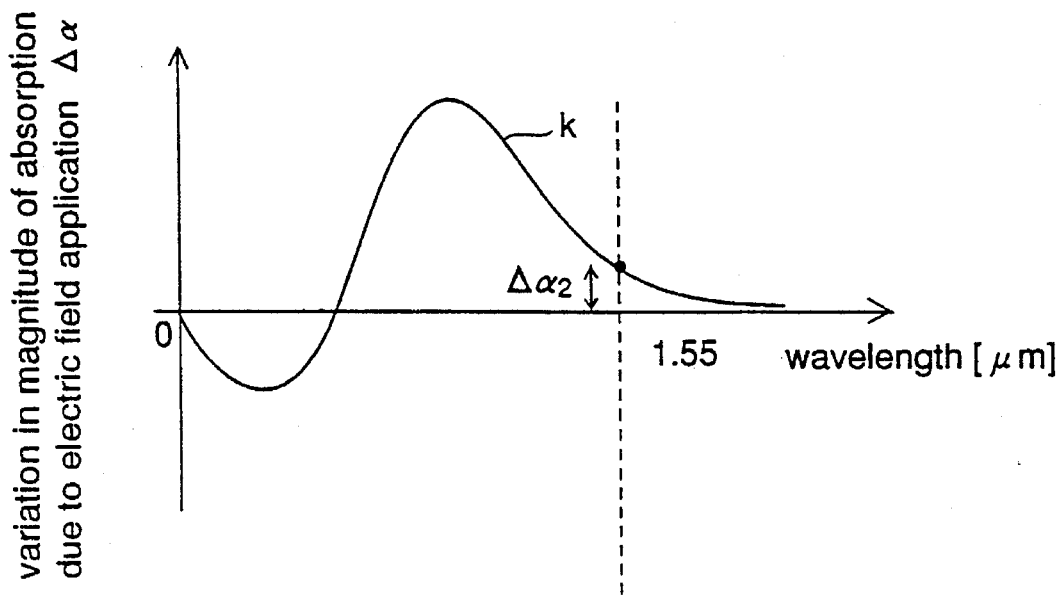
FIGS. 22(a) and 22(b) are graphs for explaining problems of the electric field applied type TTG semiconductor laser device shown in FIG. 21.
Figure 22:
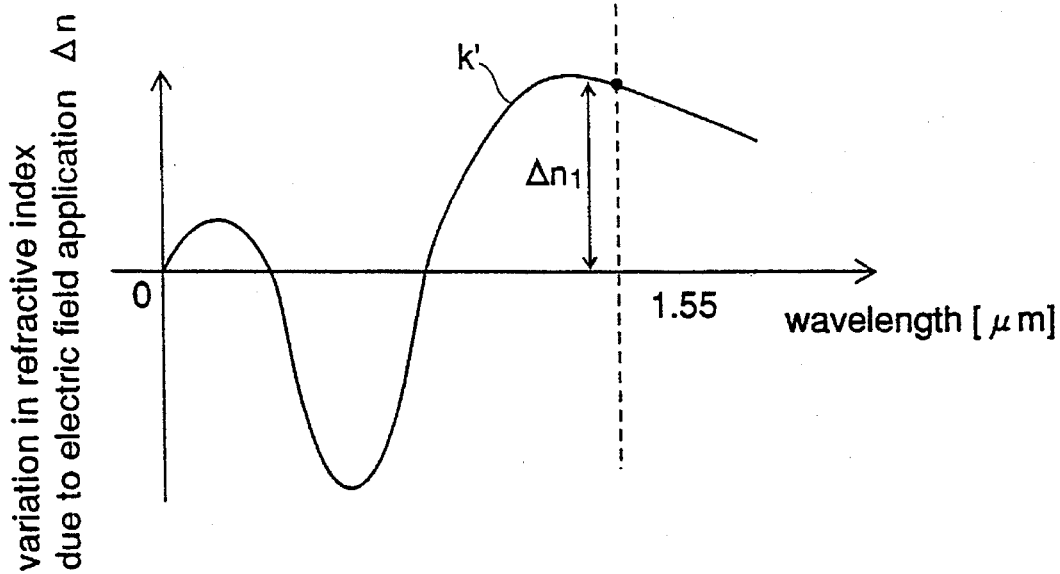

FIG. 11 is a diagram for explaining a wavelength tunable semiconductor laser device in accordance with a sixth embodiment of the present invention. In the figure, reference numeral 100 designates a TTG semiconductor laser having the same structure as the prior art TTG laser shown in FIG. 19. More specifically, reference numeral 171 designates a p type InP substrate. A first p type InP buffer layer 172 is disposed on the substrate 171. A tuning layer 178 is disposed on the first p type InP buffer layer 172. An n type InP spacer layer 177 is disposed on the tuning layer 178. An active layer 176 is disposed on the spacer layer 177. A p type InP guide layer 174a is disposed on the active layer 176. A diffraction grating layer 175 comprising a plurality of stripes is disposed on the guide layer 174a. A second p type InP buffer layer 174b is disposed on the guide layer 174a so as to bury the stripes of the diffraction grating layer 175. A third p type InP buffer layer 174c is disposed on the second p type InP buffer layer 174b and on the diffraction grating layer 175. A p type InGaAs contact layer 183 is disposed on the third p type InP buffer layer 174c. A laser driving p side electrode 182 is disposed in contact with the contact layer 183, and a tuning p side electrode 180 is disposed on the rear surface of the substrate 171.

Reference numeral 60 designates an external modulator comprising a phase modulator 60a and a light intensity modulator 60b. Laser light emitted from a laser facet of the wavelength tunable laser 100 is transmitted through an optical fiber 70 to the modulator 60. The laser light subjected to modulation and reflection in the modulator 60 is returned to the laser facet of the wavelength tunable laser through the optical fiber 70.

Figure 12:
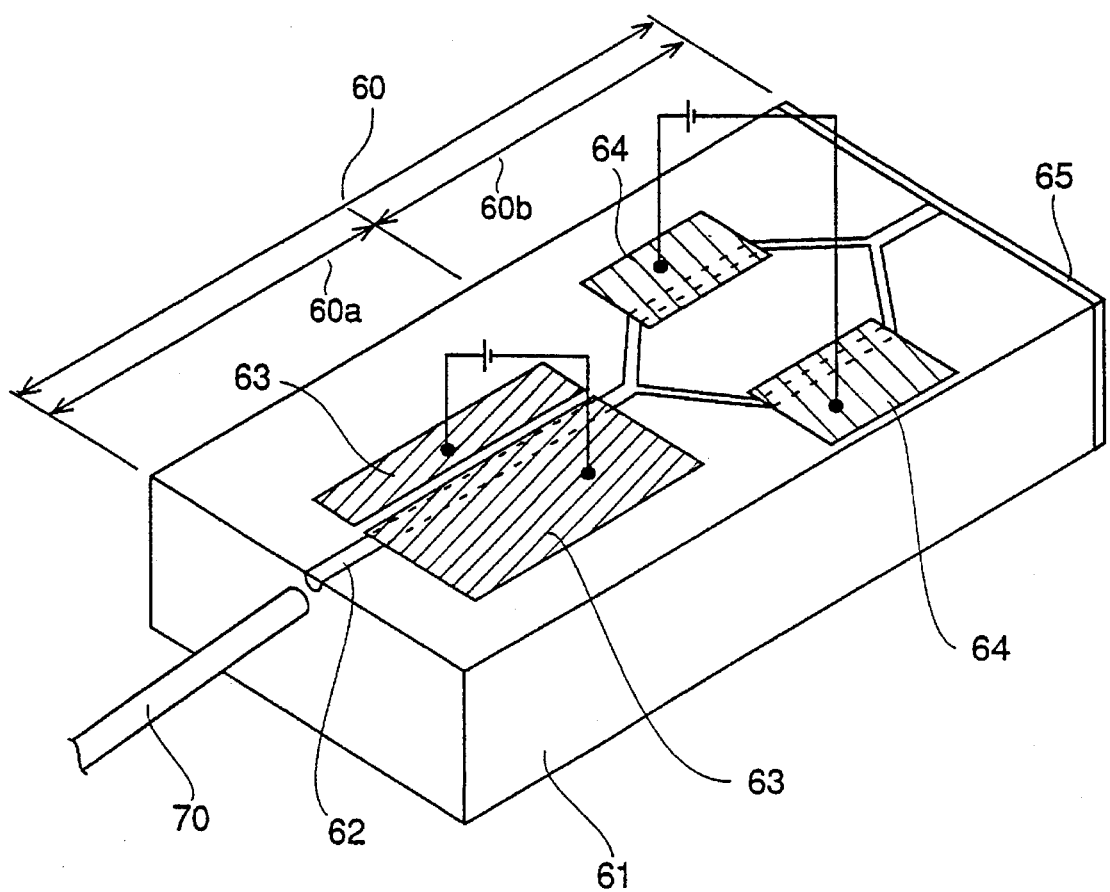
FIG. 12 is a perspective view illustrating an example of an external modulator included in the wavelength tunable semiconductor laser device of FIG. 11 according to the sixth embodiment of the invention.

FIG. 12 is a perspective view of a specific structure of the external modulator 60. This external modulator 60 comprises a dielectric substrate 61, such as LiNbO₃, an HR coating layer 65 disposed on a facet of the modulator, a Ti-diffused waveguide 62 having a prescribed pattern on the dielectric substrate 61, a first electrode 63 for the phase modulator 60a disposed on the substrate 61 at the waveguide I/O terminal side, and a second electrode 64 for the intensity modulator 60b disposed on the substrate 61 at the HR coating 65 side.

Figure 13:
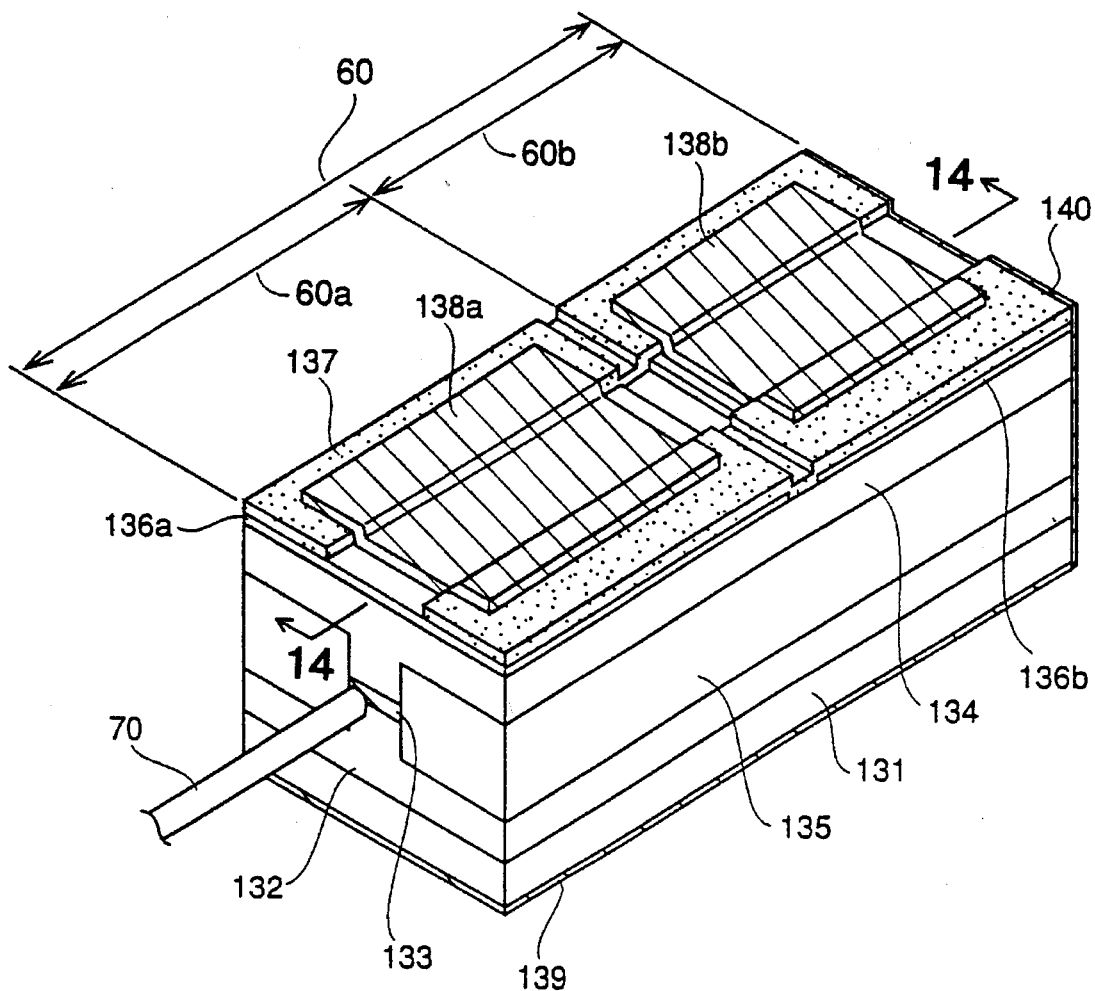
FIG. 13 is a perspective view illustrating another example of the external modulator included in the wavelength tunable semiconductor laser device of FIG. 11 according to the sixth embodiment of the invention.
Figure 14:
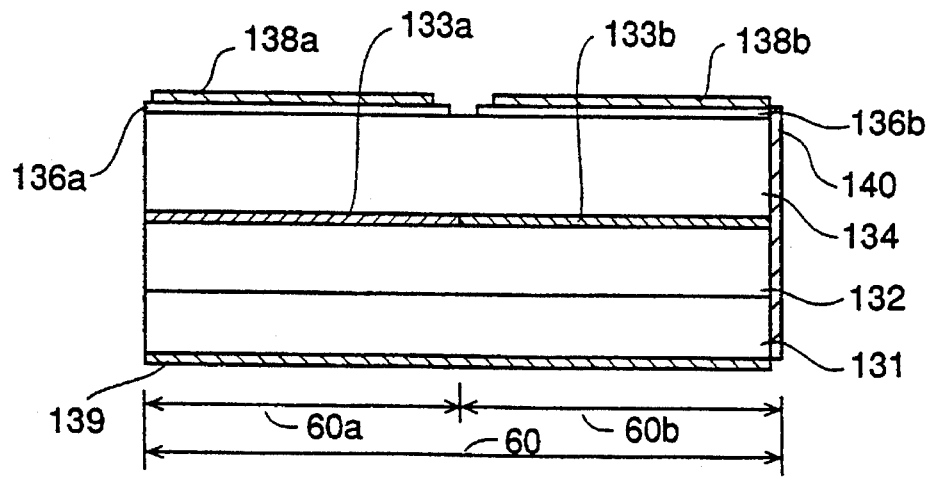
FIG. 14 is a sectional view of the external modulator shown in FIG. 13 taken along the optical waveguide direction.

FIG. 13 is a perspective view illustrating another example of the external modulator 60. FIG. 14 is a sectional view taken along a line 14—14 in FIG. 13. In these figures, reference numeral 131 designates a p type InP substrate. A p type InP buffer layer 132 is disposed on the substrate 132. The buffer layer 132 has a stripe-shaped ridge in the center of the structure. A light guide layer 133 is disposed on the ridge of the buffer layer 132. The light guide layer 133 has a multiquantum well (hereinafter referred to as MQW) structure comprising InGaAsP, and the MQW structure is designed so that a portion 133a of the light guide layer in the phase modulator section 60a has a band gap energy corresponding to a wavelength λg of 1.3 μm and a portion 133b of the light guide layer in the intensity modulator section 60b has a band gap energy corresponding to a wavelength λg of 1.5 μm. A semi-insulating InP layer 135 is disposed on the buffer layer 132, contacting both sides of the ridge. An n type InP buffer layer 134 is disposed on the light guide layer 133 and on the semi-insulating InP layer 135. First and second n type InGaAs contact layers 136a and 136b are disposed on the buffer layer 134 in the phase modulator section 60a and the intensity modulator section 60b, respectively. An insulating film 157 having a stripe-shaped opening opposite the stripe-shaped ridge is disposed on the contact layers 136. First and second n side electrodes 138a and 138b are disposed in contact with the contact layers 136a and 136b in the phase modulator section 60a and the intensity modulator section 60b, respectively. A p side electrode 139 is disposed on the rear surface of the substrate 131. An HR coating layer 140 is disposed on a facet of the laser structure.

Figure 15:
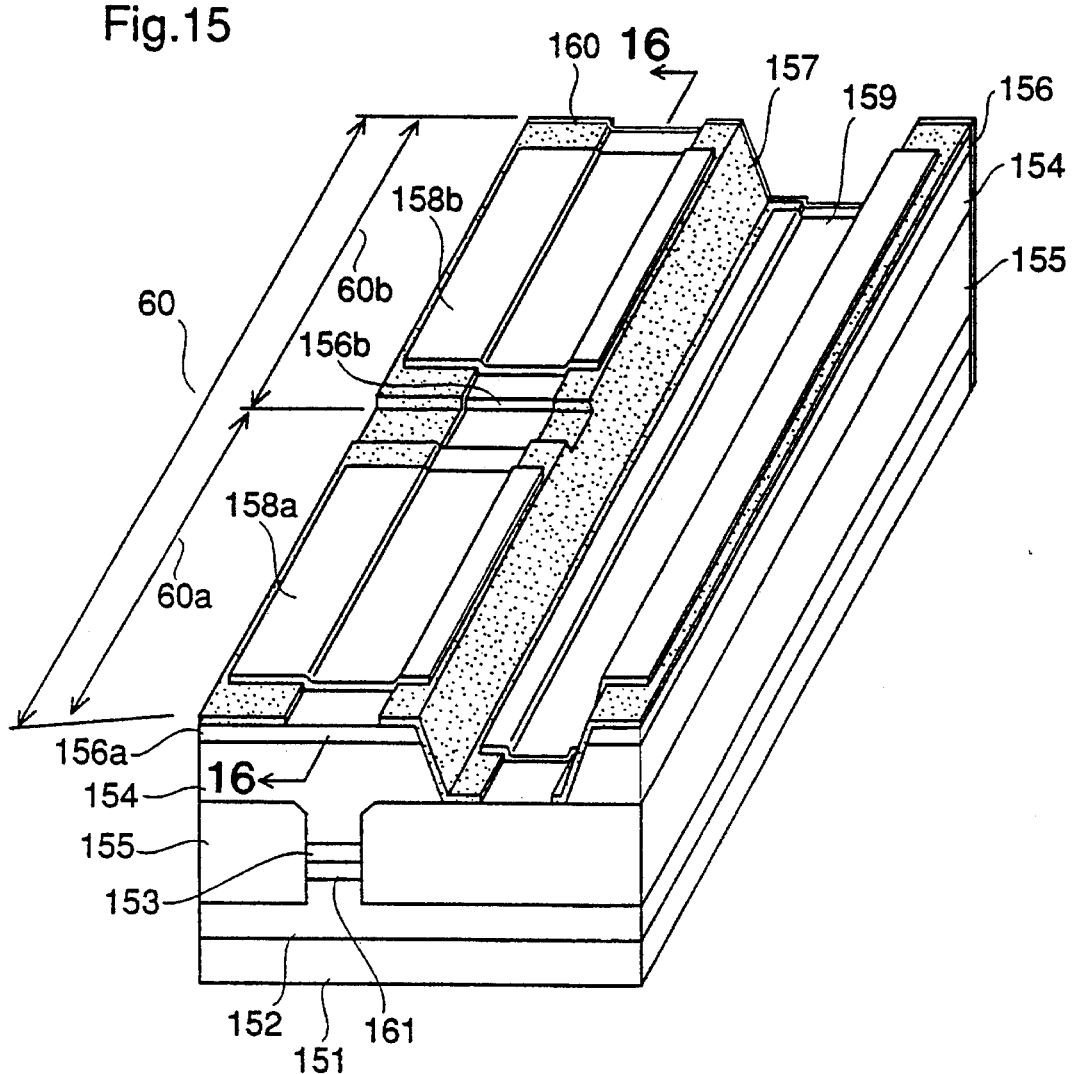
FIG. 15 is a perspective view illustrating still another example of the external modulator included in the wavelength tunable semiconductor laser device of FIG. 11 according to the sixth embodiment of the invention.
Figure 16:
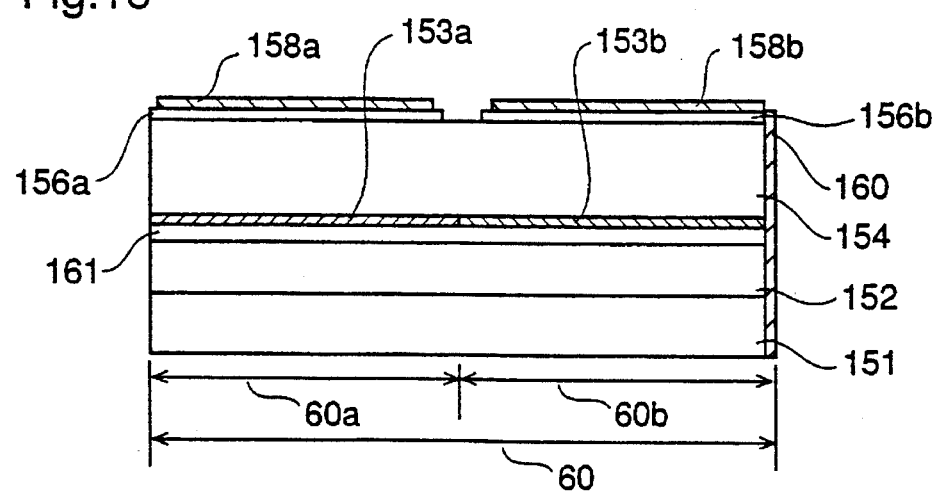
FIG. 16 is a sectional view of the external modulator shown in FIG. 15 taken along the optical waveguide direction.

FIG. 15 is a perspective view illustrating still another example of the external modulator 60. FIG. 16 is a sectional view taken along a line 16—16 of FIG. 15. The modulator comprises a phase modulator section 60a and an intensity modulator section 60b. Reference numeral 151 designates a p type InP substrate. A first p type InP buffer layer 152 having a stripe-shaped ridge portion is disposed on the substrate 151. An n type InP layer 161 is disposed on the top of the ridge of the first p type InP buffer layer 152. A light guide layer 153 is disposed on the n type InP layer 161. The light guide layer 153 is designed so that a portion 153a in the phase modulator section 60a has a band gap energy corresponding to a wavelength λg of 1.3 μm and a portion 153b in the intensity modulator section 153b has a band gap energy corresponding to a wavelength λg of 1.5 μm. An n type InP layer 155 is disposed on the first p type-InP buffer layer 152, contacting both sides of the ridge. A second p type InP buffer layer 154 is disposed on the light guide layer 153 and on the n type InP layer 155. First and second n type InGaAs contact layers 156a and 156b are disposed on the second p type InP buffer layer 154 in the phase modulator section 60a and the intensity modulator section 60b, respectively. An insulating film 157 is selectively disposed on the structure. A first p side electrode 158a is disposed in contact with the first contact layer 156a in the phase modulator section 60a, and a second p side electrode 158b is disposed on the second contact layer 156b in the intensity modulator section 60b. An n side electrode 159 is disposed in contact with the n type InP layer 155. An HR coating layer 160 is disposed on a facet of the laser structure.

The wavelength tunable semiconductor laser device according to this sixth embodiment of the present invention includes the electric field applied TTG semiconductor laser 100 and the external modulator 60 as shown in FIGS. 12–16. Laser light emitted from the TTG laser 100 is transmitted through the optical fiber 70 to the external modulator 60. The laser light is modulated and reflected in the modulator 60. The light intensity of the external modulator 60 is controlled with an increase in the absorption loss due to the application of an electric field to the tuning layer 178, whereby the intensity of the laser light reflected in the external modulator 60 and returned to the TTG laser 100 is increased to compensate the absorption loss in the tuning layer 178. As a result, a wide wavelength tunable range is obtained.

While in the above-described sixth embodiment emphasis has been placed upon a semiconductor laser employing an InP substrate, a similar structure employing a GaAs substrate and comprising other III–V compound semiconductor materials is within the scope of the invention.

Embodiment 7

Figure 17:
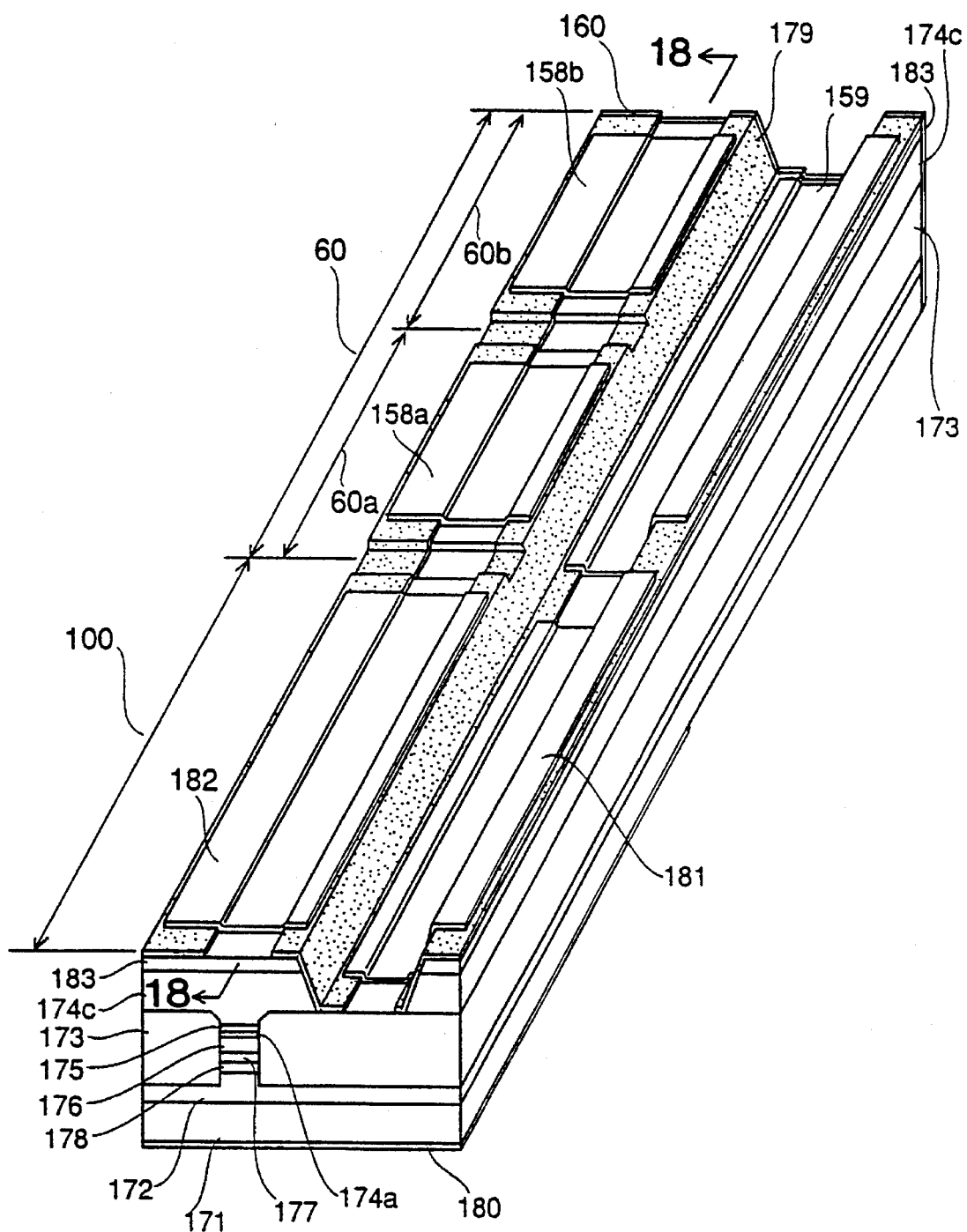
FIG. 17 is a perspective view illustrating a wavelength tunable semiconductor laser in accordance with a seventh embodiment of the present invention.
Figure 18:
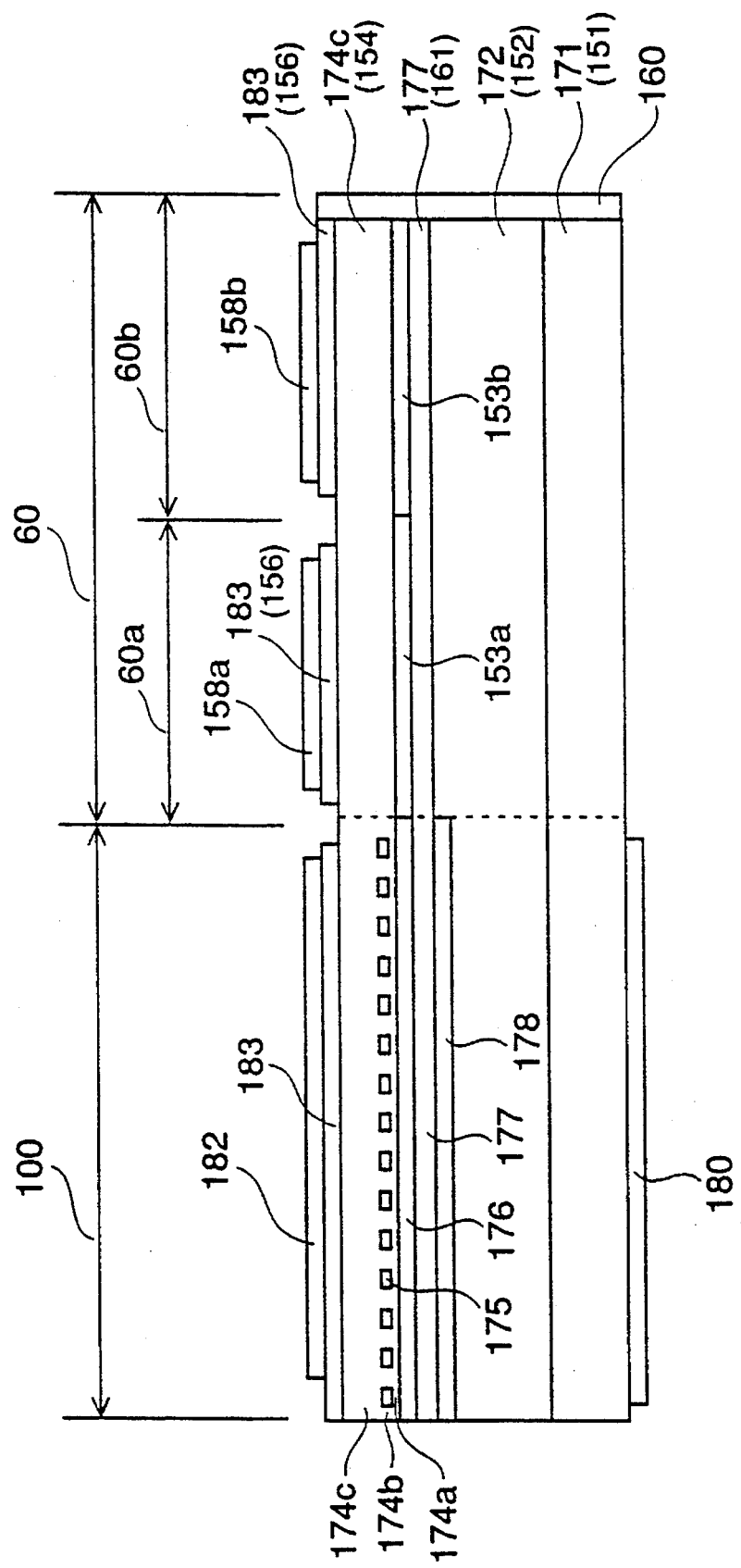
FIG. 18 is a sectional view of the semiconductor laser shown in FIG. 17 taken along a line 18—18 in FIG. 17.

FIG. 17 is a perspective view illustrating a wavelength tunable semiconductor laser device in accordance with a seventh embodiment of the present invention. FIG. 18 is a sectional view taken along a line 18—18 of FIG. 17. In the figures, the same reference numerals as in FIGS. 11 and 15 designate the same or corresponding parts.

In this seventh embodiment of the invention, the wavelength tunable semiconductor laser 100 and the external modulator 60 which are connected with each other through the optical fiber 70 in the above-described sixth embodiment are integrated on the same substrate.

Also in this seventh embodiment, the absorption loss in the tuning layer 178 of the laser 100 is compensated by controlling the intensity of light to be returned to the laser 100 with the modulator 60, resulting in a wide wavelength tuning range.

While in this seventh embodiment emphasis has been placed upon a semiconductor laser employing an InP substrate, a similar structure employing a GaAs substrate and comprising other III–V compound semiconductor materials is within the scope of the invention.

What is claimed is:

1. A wavelength tunable semiconductor laser device comprising:

a semiconductor substrate of a first conductivity type;

a semiconductor active layer located opposite the semiconductor substrate and producing light in response to current injected into the active layer, the light having a wavelength;

a semiconductor tuning layer located opposite the semiconductor substrate and having a refractive index that varies in response to an electric field applied to the tuning layer, a tuning layer tuning the wavelength of the light produced by the laser in response to the refractive index controlled by the electric field applied to the tuning layer;

a semiconductor spacer layer of a second conductivity type, opposite the first conductivity type, interposed between the active layer and the tuning layer;

front and rear resonator facets located at opposite ends of the semiconductor active layer and of the semiconductor tuning layer and having different reflectivities from each other;

a first electrode in electrical contact with the tuning layer for applying an electric field to the semiconductor tuning layer, the first electrode being divided into a plurality of portions in a resonator length direction of the semiconductor, laser;

a second electrode disposed on the semiconductor substrate for injecting current into the semiconductor active layer; and a third electrode commonly used with the first and second electrodes, the third electrode being in electrical contact with the semiconductor spacer layer.

2. The wavelength tunable semiconductor laser device of claim 1 comprising a variable voltage supply connected between each of the first and second electrodes and the third electrode, said variable voltage supply supplying a voltage to the laser structure so that light absorption loss caused by application of electric fields is maintained constant regardless of the electric fields applied by the first and second electrodes.

3. The wavelength tunable semiconductor laser device of claim 2 wherein the semiconductor active layer is located between the semiconductor tuning layer and the semiconductor substrate.

4. A wavelength tunable semiconductor laser device comprising:

a semiconductor substrate of a first conductivity type;

a semiconductor active layer located opposite the semiconductor substrate and producing light in response to current injected into the active layer, the light having a wavelength;

a semiconductor tuning layer located opposite the semiconductor substrate and having a refractive index that varies in response to an electric field applied to the tuning layer, the tuning layer tuning the wavelength of the light produced by the laser in response to the refractive index controlled by the electric field applied to the tuning layer;

a semiconductor spacer layer of a second conductivity type, opposite the first conductivity type, interposed between the active layer and the tuning layer;

front and rear resonator facets located at opposite ends of the semiconductor active layer and of the semiconductor tuning layer and having different reflectivities from each other;

a first electrode in electrical contact with the semiconductor substrate for applying an electric field to the semiconductor tuning layer;

a second electrode in electrical contact with the tuning layer for injecting current into the semiconductor active layer, the second electrode being divided into a plurality of portions in a resonator length direction of the semiconductor laser; and a third electrode commonly used with the first and second electrodes, the third electrode being in electrical contact with the semiconductor spacer layer.

5. The wavelength tunable semiconductor laser device of claim 1 comprising first and second power supply ICs respectively connected between each of the first and second electrodes and the third electrode, said first and second power supplies supplying voltages to the laser structure so that a threshold carrier concentration is maintained constant regardless of light absorption loss caused by application of an electric field by the first electrode.

6. The wavelength tunable semiconductor laser device of claim 5 wherein the semiconductor tuning layer is located between the semiconductor active layer and the semiconductor substrate.

7. A wavelength tunable semiconductor laser device comprising:

a semiconductor substrate of a first conductivity type;

a semiconductor active layer located opposite the semiconductor substrate and producing light in response to current injected into the active layer, the light having a wavelength;

a semiconductor tuning layer located opposite the semiconductor substrate and comprising a plurality of regions arranged in a resonator length direction of the laser, the regions providing respective different variations in refractive index and light absorption in response to an applied electric field, the tuning layer tuning the wavelength of the light produced by the laser in response to the refractive index controlled by the electric field applied to the tuning layer;

a semiconductor spacer layer of a second conductivity type, opposite the first conductivity type, interposed between the active layer and the tuning layer;

front and rear resonator facets located at opposite ends of the semiconductor active layer and of the semiconductor tuning layer and having different reflectivities from each other;

a first electrode in electrical contact with the tuning layer for applying an electric field to the semiconductor tuning layer, the first electrode being divided into a plurality of portions in a resonator length direction of the semiconductor laser;

a second electrode disposed on the semiconductor substrate for injecting current into the semiconductor active layer; and a third electrode common to the first and second electrodes, the third electrode being in electrical contact with the semiconductor spacer layer.

8. The wavelength tunable semiconductor laser device of claim 7 comprising a variable voltage supply connected between each of the first and second electrodes and the third electrode, said variable voltage supply supplying a voltage to the laser structure so that light absorption loss caused by application of electric fields is maintained constant regardless of the electric fields applied by the first and second electrodes.

9. A wavelength tunable semiconductor laser device comprising:

a semiconductor substrate;

a semiconductor active layer located opposite the semiconductor substrate and producing light in response to current injected into the active layer, the light having a wavelength;

a semiconductor tuning layer located opposite the semiconductor substrate and having a refractive index that varies in response to an electric field applied to the tuning layer and tuning the wavelength of the light produced by the laser in response to the refractive index controlled by the electric field applied to the tuning layer;

a semiconductor layer having a varying thickness, thereby providing a periodic diffraction grating in a resonator length direction of the semiconductor laser;

a first electrode in electrical contact with the tuning layer for applying a first electric field to the semiconductor tuning layer;

a second electrode in electrical contact with the semiconductor substrate for injecting current into the semiconductor active layer; and a third electrode in electrical contact with the tuning layer for applying a second electric field to the semiconductor layer providing the diffraction grating for coupling of the diffraction grating and compensating for light absorption loss caused by application of the first electric field to the tuning layer; and a fourth electrode commonly used with the first, second, and third electrodes.

10. The wavelength tunable semiconductor laser device of claim 9 comprising a semiconductor spacer layer disposed on the active layer and wherein the semiconductor substrate is of a first conductivity type, the semiconductor active layer is disposed on the semiconductor substrate, the semiconductor tuning layer is disposed on the spacer layer, the semiconductor layer providing the diffraction grating is disposed in contact with the semiconductor tuning layer, the fourth electrode is electrically connected to the semiconductor spacer layer, and the first electrode also serves as the third electrode.

11. The wavelength tunable semiconductor laser device of claim 9 wherein the semiconductor substrate is of a second conductivity type and has opposite front and rear surfaces, the semiconductor active layer, the semiconductor tuning layer, and the semiconductor layer providing the diffraction grating are located on the front surface of the semiconductor substrate side-by-side extending in the resonator length direction;

the first electrode, the second electrode, and the third electrode are located side-by-side, opposite the tuning layer, the active layer, and the semiconductor layer providing the diffraction grating, respectively; and the fourth electrode is disposed on the rear surface of the semiconductor substrate.

12. A wavelength tunable semiconductor laser device comprising:

a semiconductor substrate;

a semiconductor active layer located opposite the semiconductor substrate and producing light in response to current injected into the active layer, the light having a wavelength;

a semiconductor tuning layer located opposite the semiconductor substrate and having a refractive index that varies in response to an electric field applied to the tuning layer and tuning the wavelength of the light produced by the laser in response to the refractive index controlled by the electric field applied to the tuning layer;

a first electrode in electrical contact with the tuning layer for applying an electric field to the semiconductor tuning layer;

a second electrode in electrical contact with the semiconductor substrate for injecting current into the semiconductor active layer; and a third electrode commonly used with the first applying electrode and second electrodes; and a light modulator for controlling the light generated in and transmitted through the active layer so that light absorption loss caused by application of an electric field to the tuning layer is compensated.

13. The wavelength tunable semiconductor laser device of claim 12 including a second substrate wherein the light modulator is disposed on the second substrate.

14. The wavelength tunable semiconductor laser device of claim 12 wherein the light modulator and the active layer are located on the semiconductor substrate.

* * * * *

UNITED STATES PATENT AND TRADEMARK OFFICE
CERTIFICATE OF CORRECTION

PATENT NO. : 5,568,311
DATED : October 22, 1996
INVENTOR(S) : Matsumoto

It is certified that error appears in the above-indentified patent and that said Letters Patent is hereby corrected as shown below:

Item 57: Abstract, Line 17, after "third" insert

--electrode common to the first--;

Column 20, Line 45, change "a" to --the--.

Signed and Sealed this

Eighteenth Day of March, 1997

Attest:

BRUCE LEHMAN

Attesting Officer

Commissioner of Patents and Trademarks